(12) United States Patent
Huang

(10) Patent No.: US 12,004,358 B2
(45) Date of Patent: Jun. 4, 2024

(54) DUAL COLOR DETECTION SYSTEMS AND METHODS

(71) Applicant: Teledyne FLIR Commercial Systems, Inc., Goleta, CA (US)

(72) Inventor: Edward K. Huang, Goleta, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 381 days.

(21) Appl. No.: 17/222,931

(22) Filed: Apr. 5, 2021

(65) Prior Publication Data

US 2021/0225941 A1 Jul. 22, 2021

Related U.S. Application Data

(63) Continuation of application No. PCT/US2019/054900, filed on Oct. 4, 2019.

(60) Provisional application No. 62/742,225, filed on Oct. 5, 2018.

(51) Int. Cl.
*H10K 39/32* (2023.01)
*H01L 27/146* (2006.01)
*H04N 23/11* (2023.01)
*H04N 25/709* (2023.01)
*H04N 25/75* (2023.01)

(52) U.S. Cl.
CPC ....... *H10K 39/32* (2023.02); *H01L 27/14649* (2013.01); *H01L 27/14685* (2013.01); *H04N 23/11* (2023.01); *H04N 25/709* (2023.01); *H04N 25/75* (2023.01)

(58) Field of Classification Search
CPC .............. H10K 39/32; H01L 27/14649; H01L 27/14685; H01L 27/14603; H01L 27/1465; H01L 27/14652; H01L 31/1013; H04N 23/11; H04N 25/709; H04N 25/75
See application file for complete search history.

(56) References Cited

U.S. PATENT DOCUMENTS

| 5,599,733 | A | 2/1997 | Wan et al. |
| 9,755,091 | B2 * | 9/2017 | Delaunay ........ H01L 31/035236 |
| 2007/0158638 | A1 | 7/2007 | Perera et al. |
| 2009/0121307 | A1 | 5/2009 | Tennant |
| 2011/0136290 | A1 * | 6/2011 | Ko .................... H01L 27/14689 |
| | | | 438/70 |
| 2011/0284756 | A1 | 11/2011 | Miko et al. |

(Continued)

FOREIGN PATENT DOCUMENTS

| EP | 1 817 802 | 8/2007 |
| WO | WO 2006062721 | 6/2006 |

*Primary Examiner* — Fernando Alcon
(74) *Attorney, Agent, or Firm* — Haynes and Boone, LLP

(57) ABSTRACT

Techniques are disclosed for facilitating dual color detection. In one example, an imaging device includes a first pixel configured to detect first image data associated with a first waveband of electromagnetic radiation. The imaging device further includes a second pixel configured to detect second image data associated with a second waveband of the electromagnetic radiation, where at least a portion of the second waveband does not overlap the first waveband. The imaging device further includes a bias circuit configured to apply a first voltage between the first pixel and a first ground contact, and apply a second voltage between the second pixel and a second ground contact. The first voltage is different from the second voltage. Related methods are also provided.

20 Claims, 23 Drawing Sheets

(56) References Cited

U.S. PATENT DOCUMENTS

2013/0043372 A1* 2/2013 Wehner ............ H01L 27/14652
　　　　　　　　　　　　　　　　　　　　　　　250/208.1
2015/0243825 A1　8/2015 Keasler et al.
2018/0019280 A1* 1/2018 Lee .................. H01L 27/14687

* cited by examiner

DUAL COLOR DETECTION SYSTEMS AND METHODS

CROSS-REFERENCE TO RELATED APPLICATION

This application is a continuation of International Patent Application No. PCT/US2019/054900 filed Oct. 4, 2019 and entitled "DUAL BAND PHOTODETECTION SYSTEM AND METHOD", which is incorporated herein by reference in its entirety.

International Patent Application No. PCT/US2019/054900 claims priority to and the benefit of U.S. Provisional Patent Application No. 62/742,225 filed Oct. 5, 2018 and entitled "DUAL COLOR DETECTION SYSTEMS AND METHODS," which is hereby incorporated by reference in its entirety

TECHNICAL FIELD

One or more embodiments relate generally to imaging systems and more particularly, for example, to dual color detection.

BACKGROUND

Imaging systems may include an array of detectors, with each detector functioning as a pixel to produce a portion of a two-dimensional image. There are a wide variety of image detectors, such as visible-light image detectors, infrared image detectors, or other types of image detectors that may be provided in an image detector array for capturing an image. As an example, a plurality of sensors may be provided in an image detector array to detect electromagnetic (EM) radiation at desired wavelengths. In some cases, such as for infrared imaging, readout of image data captured by the detectors may be performed in a time-multiplexed manner by a readout integrated circuit (ROIC). The image data that is read out may be communicated to other circuitry, such as for processing, storage, and/or display. In some cases, a combination of a detector array and an ROIC may be referred to as a focal plane array (FPA). Advances in process technology for FPAs and image processing have led to increased capabilities and sophistication of resulting imaging systems.

SUMMARY

In one or more embodiments, an imaging device includes a first pixel configured to detect first image data associated with a first waveband of electromagnetic radiation. The imaging device further includes a second pixel configured to detect second image data associated with a second waveband of the electromagnetic radiation. At least a portion of the second waveband does not overlap the first waveband. The imaging device further includes a bias circuit configured to apply a first voltage between the first pixel and a first ground contact, and apply a second voltage between the second pixel and a second ground contact, where the first voltage is different from the second voltage.

In one or more embodiments, a method for fabricating an imaging device includes providing a first layer having a first conductivity type. The method further includes forming a second layer on the first layer. The second layer has a second conductivity type different from the first conductivity type. The method further includes forming a third layer on the second layer. The third layer has the first conductivity type. The method further includes forming a first set of pixels of the imaging device. Each pixel of the first set of pixels is formed by removing a respective portion of each of the first layer, the second layer, and the third layer. The first set of pixels is associated with detection of a first waveband of electromagnetic radiation. The method further includes forming a second set of pixels of the imaging device. Each pixel of the second set of pixels is formed by removing a respective portion of the first layer. The second set of pixels is associated with detection of a second waveband of the electromagnetic radiation. At least a portion of the second waveband does not overlap the first waveband.

In one or more embodiments, a method for operating an imaging device includes applying, by a bias circuit of the imaging device, a first voltage between a first pixel of the imaging device and a first ground contact. The method further includes applying, by the bias circuit, a second voltage between a second pixel of the imaging device and a second ground contact. The method further includes detecting, by the first pixel, first image data associated with a first waveband of electromagnetic radiation. The method further includes detecting, by the second pixel, second image data associated with a second waveband of the electromagnetic radiation. At least a portion of the second waveband does not overlap the first waveband.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
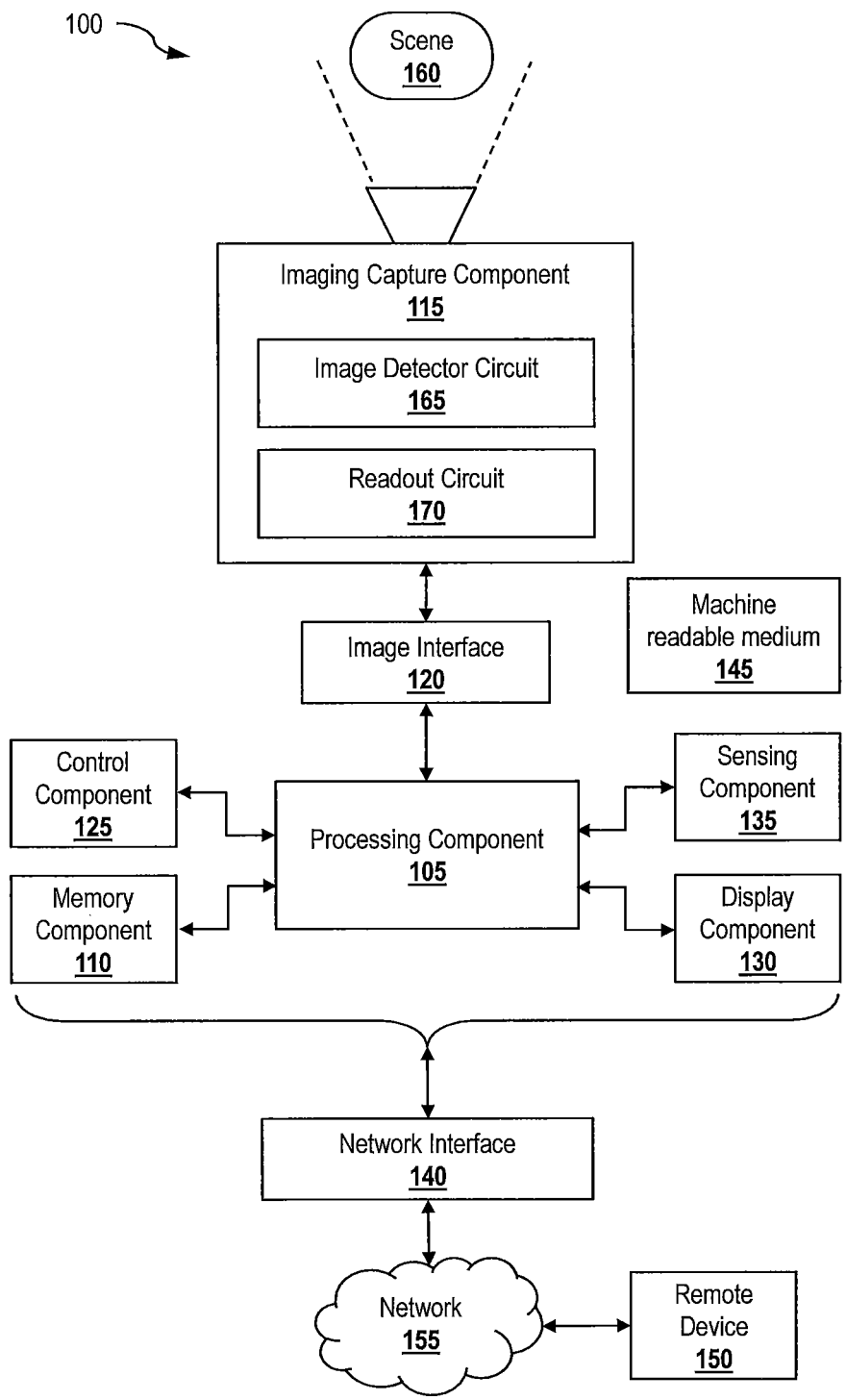
FIG. 1 illustrates a block diagram of an example imaging system in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various embodiments of methods and systems disclosed herein may be used to facilitate dual color detection. An imaging system has a dual color detector architecture for facilitating dual color detection capability. The imaging system may include an image detector circuit (e.g., detector array) and a readout circuit. The image detector circuit may include a first set of pixels (e.g., also referred to as detectors or channels) and a second set of pixels. The first set of pixels may detect image data associated with components of incident EM radiation having a first wavelength range and generate signals (e.g., electrical signals) indicative of the detected image data. The second set of pixels may detect image data associated with components of the incident EM radiation having a second wavelength range and generate signals indicative of the detected image data. In some aspects, the first wavelength range may have at least a portion that does not overlap the second wavelength range. For example, the first wavelength range may partially overlap or, alternatively, may be completely disjoint from the second wavelength range.

Wavelength ranges may be provided equivalently using frequency ranges or energy ranges. In an aspect, wavelength ranges, frequency ranges, or energy ranges refer to portions of the EM spectrum and may be referred to as wavebands (or simply bands) or colors. In this regard, the first wavelength range and the second wavelength range may be referred to as a first waveband and a second waveband, respectively. As an example, the first waveband of the imaging system may be a portion of the visible-light spectrum and the second waveband of the imaging system may be a portion of the infrared spectrum. As another example, the first waveband of the imaging system may be a portion of short-wave infrared and the second waveband of the imaging system may be a portion of long-wave infrared.

In some embodiments, each pixel of the first and second sets of pixels may include a stacked detector structure. The stacked detector structure may include stacked semiconductor layers. In some cases, one or more of the semiconductor layers may be formed through epitaxial growth. Dopants may be applied during or subsequent to the epitaxial growth. In some aspects, the stacked detector structure implements a back-to-back junction architecture. As one example, the back-to-back junction architecture may have an npn structure that includes a first n-type layer, a p-type layer disposed on the first n-type layer, and a second n-type layer disposed on the p-type layer. As another example, the back-to-back junction architecture may have a pnp structure that includes a first p-type layer, an n-type layer disposed on the first p-type layer, and a second p-type layer disposed on the n-type layer. In either example, the back-to-back junction architecture may include (but need not include) a barrier layer disposed between an n-type layer and a p-type layer.

Material system and/or architecture utilized to implement the stacked detector structures are generally application specific. For example, the material system and/or architecture may be configured to have a desired bandgap(s) (e.g., desired combination/arrangement of bandgaps), facilitate extraction of photocarriers, and/or facilitate blocking of majority carriers. N-type and p-type layers may be composed of any semiconductor material (e.g., photosensitive semiconductor material) with n-type doping and p-type doping, respectively. The n-type layers and p-type layers may be intentionally doped and/or intrinsically doped. The stacked detector structures may be implemented using bulk materials (e.g., InP, InGaAs, InAs, InAsSb), strain layered superlattices (SLSs), quantum well infrared photodetectors (QWIPs), and mercury cadmium telluride (HgCdTe or MCT). For a superlattice, different periods and/or compositions of material may be utilized to define properties (e.g., bandgap(s)) of the superlattice. Barrier layers may be employed dependent on application. In some applications, barrier layers may be formed to block majority carriers while not impeding flow of photogenerated carriers (e.g., photogenerated minority carriers). The barrier layers may be formed of appropriate material and, in some cases, dopants to minimize (e.g., reduce or eliminate) leakage current, such as generation-recombination current, and/or dark current. In some cases, the barrier layers may be formed of appropriate material and dopants to effectuate a desired wide bandgap and/or facilitate formation (e.g., epitaxial growth) of n-type layers and/or p-type layers of the npn or pnp structure. As such, it is noted that based on context an npn structure may generally refer to an npn structure (e.g., no intervening barrier layer), nBpn structure, npBn structure, or nBpBn structure, where B denotes one or more barrier layers. Similarly, a pnp structure may generally refer to a pnp structure (e.g., no intervening barrier layer), pBnp structure, pnBp structure, or pBnBp structure.

In some embodiments, the dual color detector architecture of the imaging system allows both wavebands to be read out simultaneously. The readout circuit of the imaging system may obtain, as part of a single frame, signals indicative of the image data from the first and second set of pixels. The imaging system includes a first ground contact associated with readout of the first waveband and a second ground contact associated with readout of the second waveband. The first ground contact and the second ground contact are isolated from each other, such that the ground contacts do not short each other out. In some aspects, the first set of pixels may have detector contacts that can be used to establish connection with the first ground contact, and the second set of pixels may have detector contacts that can be used to establish connection with the second ground contact. In some cases, the first and second ground contacts establish connection with each pixel through continuous layers (e.g., continuous and highly doped semiconductor layers) that form the npn or pnp structure of the pixel. In some implementations, the first ground contact and the second ground contact may be provided along a periphery of the image detector circuit. In one aspect, the first and second ground contacts may facilitate electrical access to the junctions of the back-to-back junction architecture and reduce in-pixel connections.

To facilitate simultaneous readout of the two wavebands, each of the first and second set of pixels may be biased appropriately. In an embodiment, the first and second sets of pixels are operated in reverse bias. In this regard, a bias circuit of the imaging system may apply the reverse bias on the first and second set of pixels. In an aspect, for the first set of pixels, the bias circuit may apply a bias voltage between the detector contacts of the first set of pixels and the first ground contact. For the second set of pixels, the bias circuit may apply a bias voltage between the detector contacts of the second set of pixels and the second ground contact. Such operation of the first and second sets of pixels in reverse bias may allow simultaneous extraction of photogenerated carriers from both wavebands. In some cases, such reverse bias may be applied continuously in time. In one aspect, simultaneous readout may allow temporally seeing both wavebands in time, which may be desirable at least when imaging fast-moving objects. Such simultaneous readout is in contrast to sequential readout of the two wavebands, in which readout of each waveband is modulated in time. In sequential readout, one waveband is read out after another in sequential frames and the cycle is repeated, such that each frame includes image data exclusively of one waveband.

Various embodiments of methods and systems disclosed herein may be included in or implemented as various devices and systems such as visible-light imaging systems, infrared imaging systems, imaging systems having visible-light and infrared imaging capability, mobile digital cameras, video surveillance systems, video processing systems, or other systems or devices that may need to obtain image data in one or multiple portions of the EM spectrum.

Referring now to the drawings, FIG. 1 illustrates a block diagram of an example imaging system 100 (e.g., an infrared camera) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). In an embodiment, the imaging system 100 may include a portable device and may be incorporated, for example, into a vehicle or a non-mobile installation requiring images to be stored and/or displayed. The vehicle may be a land-based vehicle (e.g., automobile), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100.

The imaging system 100 includes, according to one implementation, a processing component 105, a memory component 110, an image capture component 115, an image interface 120, a control component 125, a display component 130, a sensing component 135, and/or a network interface 140. The processing component 105, according to various embodiments, includes one or more of a processor, a microprocessor, a single-core processor, a multi-core processor, a microcontroller, a programmable logic device (PLD) (e.g., field programmable gate array (FPGA)), a digital signal processing (DSP) device, or other logic device that may be configured, by hardwiring, executing software instructions, or a combination of both, to perform various operations discussed herein for embodiments of the disclosure. The processing component 105 may be configured to interface and communicate with the various other components (e.g., 110, 115, 120, 125, 130, 135, etc.) of the imaging system 100 to perform such operations. For example, the processing component 105 may be configured to process captured image data received from the imaging capture component 115, store the image data in the memory component 110, and/or retrieve stored image data from the memory component 110. In one aspect, the processing component 105 may be configured to perform various system control operations (e.g., to control communications and operations of various components of the imaging system 100) and other image processing operations (e.g., data conversion, video analytics, etc.).

The memory component 110 includes, in one embodiment, one or more memory devices configured to store data and information, including infrared image data and information. The memory component 110 may include one or more various types of memory devices including volatile and non-volatile memory devices, such as random access memory (RAM), read-only memory (ROM), electricallyerasable read-only memory (EEPROM), flash memory, hard disk drive, and/or other types of memory. As discussed above, the processing component 105 may be configured to execute software instructions stored in the memory component 110 so as to perform method and process steps and/or operations. The processing component 105 and/or the image interface 120 may be configured to store in the memory component 110 images or digital image data captured by the image capture component 115. The processing component 105 may be configured to store processed still and/or video images in the memory component 110.

In some embodiments, a separate machine-readable medium 145 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 145 may be portable and/or located separate from the imaging system 100, with the stored software instructions and/or data provided to the imaging system 100 by coupling the machine-readable medium 145 to the imaging system 100 and/or by the imaging system 100 downloading (e.g., via a wired link and/or a wireless link) from the machine-readable medium 145. It should be appreciated that various modules may be integrated in software and/or hardware as part of the processing component 105, with code (e.g., software or configuration data) for the modules stored, for example, in the memory component 110.

The imaging system 100 may represent an imaging device, such as a video and/or still camera, to capture and process images and/or videos of a scene 160. In this regard, the image capture component 115 of the imaging system 100 may be configured to capture images (e.g., still and/or video images) of the scene 160 in a particular spectrum or modality. The image capture component 115 includes an image detector circuit 165 (e.g., a thermal infrared detector circuit) and a readout circuit 170 (e.g., an ROIC). For example, the image capture component 115 may include a first set of detectors for detecting one waveband and a second set of detectors for detecting another waveband. In some embodiments, the image detector circuit 165 may include an infrared (IR) imaging sensor (e.g., IR imaging sensor array) configured to detect IR radiation in the near, middle, and/or far IR spectrum and provide IR images (e.g., IR image data or signal) representative of the IR radiation from the scene 160. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) mid-wave IR (MWIR) radiation (e.g., EM radiation with wavelength of 2 μm to 5 μm) and/or long-wave IR (LWIR) radiation (e.g., EM radiation with wavelength of 7 μm to 14 μm), or any desired IR wavelengths (e.g., generally in the 0.7 μm to 14 μm range). In other aspects, the image detector circuit 165 may capture radiation from one or more other wavebands of the EM spectrum, such as visible-light, ultraviolet light, and so forth.

The image detector circuit 165 may capture image data associated with the scene 160. To capture the image, the image detector circuit 165 may detect image data of the scene 160 (e.g., in the form of EM radiation) and generate pixel values of the image based on the scene 160. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. The pixel value generated by the detector may be referred to as an output of the detector.

The image may be, or may be considered, a data structure that includes pixels and is a representation of the image data associated with the scene 160, with each pixel having a pixel value that represents EM radiation emitted or reflected from a portion of the scene and received by a detector that generates the pixel value. Based on context, a pixel may refer to a detector of the image detector circuit 165 that generates an associated pixel value or a pixel (e.g., pixel location, pixel coordinate) of the image formed from the generated pixel values.

In an aspect, the pixel values generated by the image detector circuit 165 may be represented in terms of digital count values generated based on the electrical signals obtained from converting the detected radiation. For example, in a case that the image detector circuit 165 includes or is otherwise coupled to an analog-to-digital converter (ADC) circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the processing component 105 that processes the detected image data as read out by the readout circuit 170, with communication of data from the readout circuit 170 to the processing component 105 facilitated by the image interface 120. An image capturing frame rate may refer to the rate (e.g., images per second) at which images are detected in a sequence by the image detector circuit 165 and provided to the processing component 105 by the readout circuit 170. The readout circuit 170 may read out the pixel values generated by the image detector circuit 165 in accordance with an integration time (e.g., also referred to as an integration period).

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the imaging capture component 115 may include one or more filters adapted to pass radiation of some wavelengths but substantially block radiation of other wavelengths. For example, the imaging capture component 115 may be an IR imaging device that includes one or more filters adapted to pass IR radiation of some wavelengths while substantially blocking IR radiation of other wavelengths (e.g., MWIR filters, thermal IR filters, and narrowband filters). In this example, such filters may be utilized to tailor the imaging capture component 115 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 115 may include an IR imaging sensor having an FPA of detectors responsive to IR radiation including near infrared (NIR), short-wave IR (SWIR), MWIR, long-wave IR (LWIR), and/or very-long wave IR (VLWIR) radiation. In some other embodiments, alternatively or in addition, the image capture component 115 may include a complementary metal oxide semiconductor (CMOS) sensor or a charge-coupled device (CCD) sensor that can be found in any consumer camera (e.g., visible light camera).

Other imaging sensors that may be embodied in the image capture component 115 include a photonic mixer device (PMD) imaging sensor or other time of flight (ToF) imaging sensor, light detection and ranging (LIDAR) imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 115 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 120 may include, in some embodiments, appropriate input ports, connectors, switches, and/or circuitry configured to interface with external devices (e.g., a remote device 150 and/or other devices) to receive images (e.g., digital image data) generated by or otherwise stored at the external devices. The received images or image data may be provided to the processing component 105. In this regard, the received images or image data may be converted into signals or data suitable for processing by the processing component 105. For example, in one embodiment, the image interface 120 may be configured to receive analog video data and convert it into suitable digital data to be provided to the processing component 105.

In some embodiments, the image interface 120 may include various standard video ports, which may be connected to a video player, a video camera, or other devices capable of generating standard video signals, and may convert the received video signals into digital video/image data suitable for processing by the processing component 105. In some embodiments, the image interface 120 may also be configured to interface with and receive images (e.g., image data) from the image capture component 115. In other embodiments, the image capture component 115 may interface directly with the processing component 105.

The control component 125 includes, in one embodiment, a user input and/or an interface device, such as a rotatable knob (e.g., potentiometer), push buttons, slide bar, keyboard, and/or other devices, that is adapted to generate a user input control signal. The processing component 105 may be configured to sense control input signals from a user via the control component 125 and respond to any sensed control input signals received therefrom. The processing component 105 may be configured to interpret such a control input signal as a value, as generally understood by one skilled in the art. In one embodiment, the control component 125 may include a control unit (e.g., a wired or wireless handheld control unit) having push buttons adapted to interface with a user and receive user input control values. In one implementation, the push buttons of the control unit may be used to control various functions of the imaging system 100, such as autofocus, menu enable and selection, field of view, brightness, contrast, noise filtering, image enhancement, and/or various other features of an imaging system or camera.

The display component 130 includes, in one embodiment, an image display device (e.g., a liquid crystal display (LCD)) or various other types of generally known video displays or monitors. The processing component 105 may be configured to display image data and information on the display component 130. The processing component 105 may be configured to retrieve image data and information from the memory component 110 and display any retrieved image data and information on the display component 130. The display component 130 may include display circuitry, which may be utilized by the processing component 105 to display image data and information. The display component 130 may be adapted to receive image data and information directly from the image capture component 115, processing component 105, and/or image interface 120, or the image data and information may be transferred from the memory component 110 via the processing component 105.

The sensing component 135 includes, in one embodiment, one or more sensors of various types, depending on the application or implementation requirements, as would be understood by one skilled in the art. Sensors of the sensing component 135 provide data and/or information to at least the processing component 105. In one aspect, the processing component 105 may be configured to communicate with the sensing component 135. In various implementations, the sensing component 135 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 135 may represent conventional sensors as generally known by one skilled in the art for monitoring various conditions (e.g., environmental conditions) that may have an effect (e.g., on the image appearance) on the image data provided by the image capture component 115.

In some implementations, the sensing component 135 (e.g., one or more sensors) may include devices that relay information to the processing component 105 via wired and/or wireless communication. For example, the sensing component 135 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the processing component 105 can use the information (e.g., sensing data) retrieved from the sensing component 135 to modify a configuration of the image capture component 115 (e.g., adjusting a light sensitivity level, adjusting a direction or angle of the image capture component 115, adjusting an aperture, etc.).

In some embodiments, various components of the imaging system 100 may be distributed and in communication with one another over a network 155. In this regard, the imaging system 100 may include a network interface 140 configured to facilitate wired and/or wireless communication among various components of the imaging system 100 over the network 155. In such embodiments, components may also be replicated if desired for particular applications of the imaging system 100. That is, components configured for same or similar operations may be distributed over a network. Further, all or part of any one of the various components may be implemented using appropriate components of the remote device 150 (e.g., a conventional digital video recorder (DVR), a computer configured for image processing, and/or other device) in communication with various components of the imaging system 100 via the network interface 140 over the network 155, if desired. Thus, for example, all or part of the processing component 105, all or part of the memory component 110, and/or all of part of the display component 130 may be implemented or replicated at the remote device 150. In some embodiments, the imaging system 100 may not include imaging sensors (e.g., image capture component 115), but instead receive images or image data from imaging sensors located separately and remotely from the processing component 105 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the processing component 105 may be combined with the memory component 110, image capture component 115, image interface 120, display component 130, sensing component 135, and/or network interface 140. In another example, the processing component 105 may be combined with the image capture component 115, such that certain functions of processing component 105 are performed by circuitry (e.g., a processor, a microprocessor, a logic device, a microcontroller, etc.) within the image capture component 115.

Figure 2A:
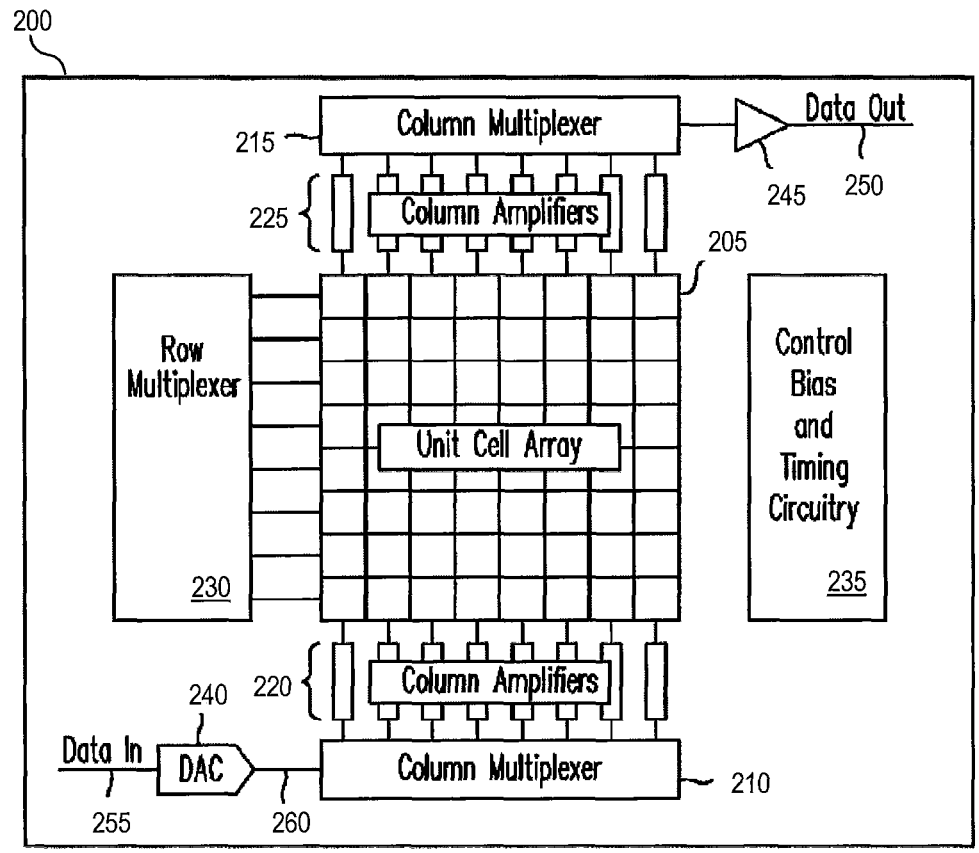
FIG. 2A illustrates a block diagram of an example image sensor assembly in accordance with one or more embodiments of the present disclosure.

FIG. 2A illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the image capture component 115 of FIG. 1.

The image sensor assembly 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. The unit cell array 205 includes an array of unit cells. In an aspect, each unit cell may include a detector and interface circuitry. The interface circuitry of each unit cell may provide an output signal, such as an output voltage or an output current, in response to a detector signal (e.g., detector current, detector voltage) provided by the detector of the unit cell. The output signal may be indicative of the magnitude of EM radiation received by the detector. The column multiplexer 215, column amplifiers 220, row multiplexer 230, and data output buffer 245 may be used to provide the output signals from the unit cell array 205 as a data output signal on a data output line 250. The data output signal may be an image formed of the pixel values for the image sensor assembly 200. In this regard, the column multiplexer 215, column amplifiers 220, row multiplexer 230, and data output buffer 245 may collectively provide an ROIC (or portion thereof) of the image sensor assembly 200.

The column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals. These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells.

In an aspect, the control bias and timing circuitry 235 may generate bias values, timing control voltages, and switch control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. In another aspect, the control bias and timing circuitry 235 may generate the bias signals (e.g., analog signals) and provide the bias signals to the unit cells without utilizing the DAC 240. In this regard, some implementations do not include the DAC 240, data input signal line 255, and/or analog signal line(s) 260. In an embodiment, the control bias and timing circuitry 235 may be, may include, may be a part of, or may otherwise be coupled to the processing component 105 and/or imaging capture component 115 of FIG. 1.

In an embodiment, the image sensor assembly 200 may be implemented as part of an imaging system (e.g., 100). In addition to the various components of the image sensor assembly 200, the imaging system may also include one or more processors, memories, logic, displays, interfaces, optics (e.g., lenses, mirrors, beamsplitters), and/or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as non-uniformity correction (NUC), spatial and/or temporal filtering, and/or other operations. The images (e.g., processed images) may be stored in memory (e.g., external to or local to the imaging system) and/or displayed on a display device (e.g., external to and/or integrated with the imaging system).

By way of non-limiting examples, the unit cell array 205 may include 512×512 (e.g., 512 rows and 512 columns of unit cells), 1024×1024, 2048×2048, 4096×4096, 8192×8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

Figure 2B:
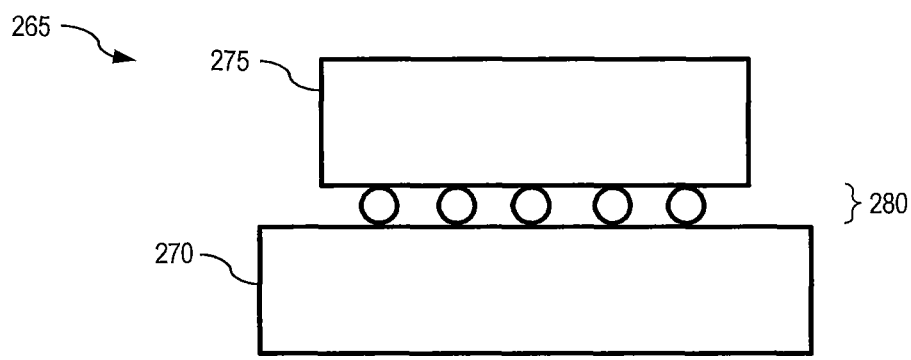
FIG. 2B illustrates an example image sensor assembly in accordance with one or more embodiments of the present disclosure.

In an embodiment, components of the image sensor assembly 200 may be implemented such that a detector array is hybridized to (e.g., bonded to) a readout circuit. For example, FIG. 2B illustrates an example image sensor assembly 265 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 265 may be, may include, or may be a part of, the image sensor assembly 200.

The image sensor assembly 265 includes a device wafer 270, a readout circuit 275, and contacts 280 to bond (e.g., mechanically and electrically bond) the device wafer 270 to the readout circuit 275. The device wafer 270 may include detectors (e.g., the unit cell array 205). The contacts 280 may bond the detectors of the device wafer 270 and the readout circuit 275. The contacts 280 may include conductive contacts of the detectors of the device wafer 270, conductive contacts of the readout circuit 275, and/or metallic bonds between the conductive contacts of the detectors and the conductive contacts of the readout circuit 275. In one embodiment, the device wafer 270 may be bump-bonded to the readout circuit 275 using bonding bumps. The bonding bumps may be formed on the device wafer 270 and/or the readout circuit 275 to allow connection between the device wafer 270 and the readout circuit 275. In an aspect, hybridizing the device wafer 270 to the readout circuit 275 may refer to bonding the device wafer 270 (e.g., the detectors of the device wafer 270) to the readout circuit 725 to mechanically and electrically bond the device wafer 270 and the readout circuit 275.

FIGS. 3A, 3B, 3C, and 3D illustrate example stacked detector structures 300, 305, 310, and 315, respectively, in accordance with one or more embodiments of the present disclosure. For explanatory purposes, a layer denoted as "Conductivity Type 1" is a layer having a first conductivity type, a layer denoted as "Conductivity Type 2" is a layer having a second conductivity type different from the first conductivity type, and a layer denoted as "B" is a barrier layer. For example, a layer having the first conductivity type may be an n-type layer and a layer having the second conductivity type may be a p-type layer, or vice versa. In some cases, a barrier layer may have the first conductivity type or the second conductivity type. In an aspect, a pixel may be implemented using the stacked detector structures 300, 305, 310, and/or 315.

Figure 3A:
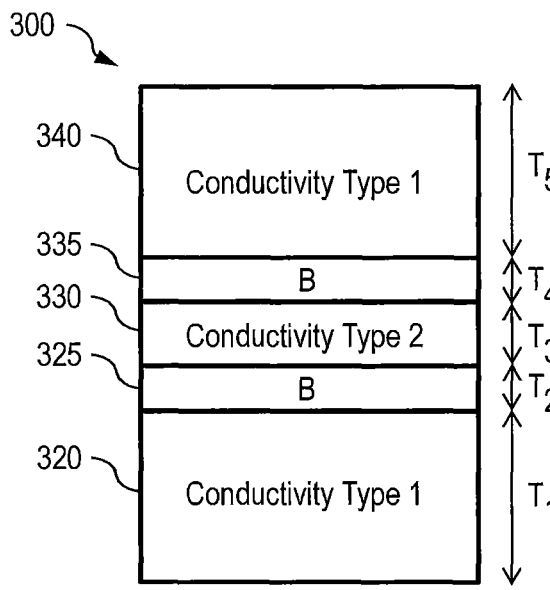
FIGS. 3A through 3D illustrate example stacked detector structures in accordance with one or more embodiments of the present disclosure.

Turning first to FIG. 3A, the stacked detector structure 300 includes layers 320 and 340 having the first conductivity type, a layer 330 having the second conductivity type, and barrier layers 325 and 335. In some cases, as shown in FIG. 3A, the barrier layer 325 is disposed on and in contact with the layer 320, the layer 330 is disposed on and in contact with the barrier layer 325, the barrier layer 335 is disposed on and in contact with the layer 330, and the layer 340 is disposed on and in contact with the barrier layer 335. Thicknesses of the layers 320, 325, 330, 335, and 340 (denoted in FIG. 3A as T1, T2, T3, T4, and T5, respectively) are generally application dependent. In an embodiment, the layers 320, 325, 330, 335, and 340 may have thicknesses approximately between 0.1 μm and 20 μm dependent on application. In some cases, such as shown in FIG. 3A, the barrier layers 325 and 335 may be thinner than the layers 320, 330, and 340, and/or the layer 330 may be thinner than the layers 320 and 340. As an example, the layers 320 and 340 may be n-type layers and the layer 330 may be a p-type layer. In this example, the stacked detector structure 300 has an nBpBn structure. As another example, the stacked detector structure 300 has a pBnBp structure.

Figure 3B:
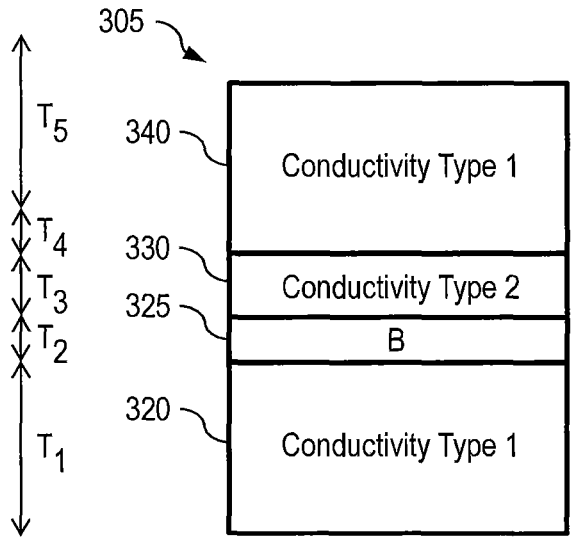
Figure 3C:
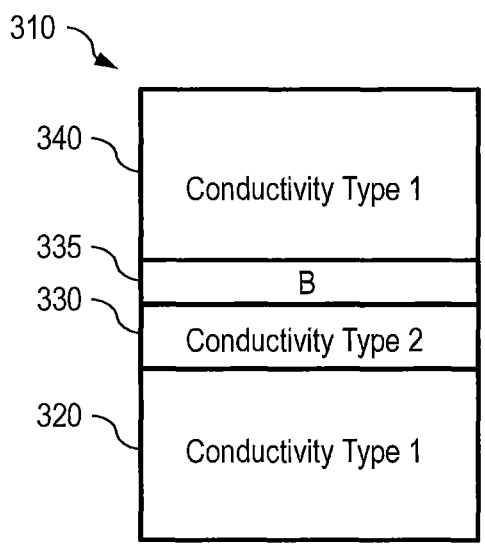
Figure 3D:
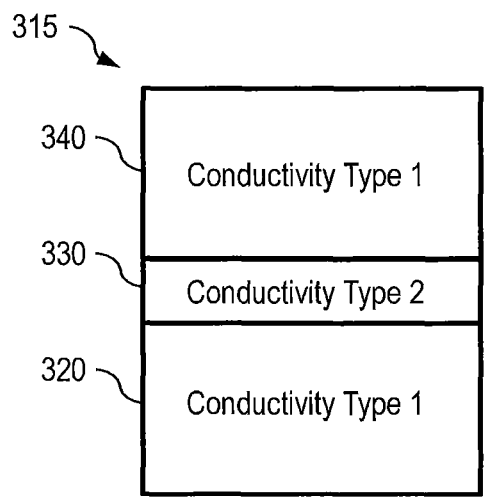

In some aspects, the barrier layer 325 and/or 335 may be optional, as shown in FIGS. 3B-3D. For example, in FIG. 3B, the stacked detector structure 305 omits the barrier layer 335 of FIG. 3A such that the layer 340 is disposed on and in contact with the layer 330. The stacked detector structure 305 may have an nBpn structure or a pBnp structure. In FIG. 3C, the stacked detector structure 310 omits the barrier layer 325 of FIG. 3A such that the layer 330 is disposed on and in contact with the layer 320. The stacked detector structure 310 may have an npBn structure or a pnBp structure. In FIG. 3D, the stacked detector structure 315 omits the barrier layers 325 and 335 of FIG. 3A such that the layer 330 is disposed on and in contact with the layer 320 and the layer 340 is disposed on and in contact with the layer 330. The stacked detector structure 310 may have an npn structure or a pnp structure. In some cases, in FIGS. 3A-3D, the layers 320, 330, and 340 form, or may be referred to as forming, a back-to-back diode structure.

Material system and/or architecture utilized to implement the stacked detector structures 300, 305, 310, and 315 are generally application specific. For example, the material system and/or architecture may be configured to have a desired bandgap(s) (e.g., desired combination/arrangement of bandgaps), facilitate extraction of photocarriers, and/or facilitate blocking of majority carriers. N-type and p-type layers may be composed of any semiconductor material (e.g., photosensitive semiconductor material) with n-type and p-type doping, respectively. The n-type layers and p-type layers may be intentionally doped and/or intrinsically doped. In some cases, barrier layers may be semiconductor layers with n-type or p-type doping. The stacked detector structures 300, 305, 310, and/or 315 may be implemented using bulk material, SLSs, quantum well infrared photodetectors QWIPs, and/or MCT.

As one non-limiting example, the layers 320, 330, and/or 340 may be a bulk material, such as InP, InGaAs, InAs, or InAsSb. Alternatively or in addition, as a non-limiting example, the layers 320, 330, and/or 340 may be a superlattice, such as an InAs/GaSb superlattice (e.g., a superlattice that alternates between a layer of InAs and a layer of GaSb) or an InAs/InAsSb superlattice. The barrier layers 325 and/or 335 may include AlSb, AlAsSb, AlGaAsSb, among others. The barrier layers 325 and/or 335 may be an n-type layer or a p-type layer. In an aspect, material for the barrier layers 325 and 335 are generally selected to block majority carriers that would otherwise be present in absorber layers and to not impede flow of photogenerated carriers. The layers 320, 330, and/or 340 and/or the barrier layers 325 and/or 335 may be doped (e.g., intentionally and/or intrinsically). As one example, in an nBpBn structure, the barrier layers 325 and/or 335 may be a p-type layer. In another example, in a pBnBp structure, the barrier layers 325 and/or 335 may be an n-type layer. Example doping concentrations of n-type layers, p-type layers, and barrier layers may be around from $10^{13}$ cm$^3$ to around $5 \times 10^{18}$ cm$^3$ dependent on application. Dopant choices are generally dependent on the material system associated with the n-type layers, the p-type layers, and the barrier layers. For example, in an InAs/GaSb superlattice, an example n-type dopant may be silicon and an example p-type dopant may be beryllium. In some cases, the barrier layers 325 and/or 335 may be utilized to minimize (e.g., reduce or eliminate) leakage current, such as generation-recombination current, and/or dark current. For example, the barrier layers 325 and/or 335 may have a wide bandgap. In this regard, appropriate material may be selected for the barrier layers 325 and/or 335 (e.g., in relation to the material system for the layers 320, 330, and 340) based on desired parameters (e.g., minimum leakage current).

In some embodiments, an imaging system is implemented with a dual-color detector architecture to facilitate readout (e.g., simultaneous readout) of two wavebands. In cases of simultaneous readout, signals indicative of image data detected by a detector array for both wavebands are read out in each frame. In some embodiments, the detector array may include a first set of pixels (e.g., also referred to as Band 1 pixels) for detecting a first waveband (e.g., first range of wavelengths) of incident EM radiation and a second set of pixels (e.g., also referred to as Band 2 pixels) for detecting a second waveband (e.g., second range of wavelengths) of the incident EM radiation. Each set of pixels may also be referred to as a group of detectors (e.g., a first group of detectors, a second group of detectors).

Each pixel in the first and second set of pixels may have a stacked detector structure. The stacked detector structure may include two np junctions and may be considered a back-to-back diode structure. For example, the stacked detector structure may have an npn structure or a pnp structure. In the npn structure, two np junctions are formed by a p-type layer disposed between the two n-type layers. In the pnp structure, two np junctions are formed by an n-type layer disposed between the two p-type layers. In some cases, the stacked detector structure may include one or more optional barrier layers interspersed between n-type and p-type layers. The Band 1 pixels and the Band 2 pixels may be configured with different detection wavelengths based on application. In some aspects, for infrared imaging, the detection wavelengths of the Band 1 pixels and the Band 2 pixels may encompass different infrared bands, such as NIR, SWIR, MWIR, LWIR, and/or VLWIR.

The imaging system may also include a readout circuit for receiving (e.g., extracting) signals indicative of the image data from the first and second sets of pixels. As an example, the first waveband may be a first portion of the infrared spectrum and the second color may be a second portion of the infrared spectrum, where the first portion may or may not partially overlap with the second portion. For explanatory purposes, Band 1 pixels refer to pixels utilized to detect/capture image data associated with the first waveband and provide associated signals indicative of the image data to the readout circuit, and Band 2 pixels refer to pixels utilized to detect/capture image data associated with a second waveband and provide associated signals indicative of the image data to the readout circuit. In some aspects, the stacked detector structure 300, 305, 310, or 315 of FIGS. 3A, 3B, 3C, and 3D, respectively, may be utilized to implement each pixel of the detector array (e.g., each pixel of the first set and second set of pixels). In some cases, such as cases in which layers of a given stacked detector structure are epitaxially grown, pixels that form the detector array have the same stacked detector structure (e.g., pixels share the same stacked detector structure, such as nBpBn).

In some embodiments, as shown and described in relation to various figures (e.g., FIGS. 8 and 14), Band 1 pixels and Band 2 pixels may be provided as part of macrocells that are repeated to form the detector array, such that the detector array is an array of macrocells. Each macrocell has a number of Band 1 pixels and a number of Band 2 pixels in an arrangement. In other embodiments, Band 1 pixels and Band 2 pixels may be distributed throughout the detector array without any repeating arrangement. Furthermore, for explanatory purposes, while FIGS. 4-15 illustrate a case in which Band 1 pixels and Band 2 pixels are implemented with the stacked detector structure 300 of FIG. 3A (e.g., nBpBn), in some embodiments the pixels may be implemented with the stacked detector structure 305 (e.g., nBpn or pBnp), 310, 315, or other detector structure.

Figure 4:
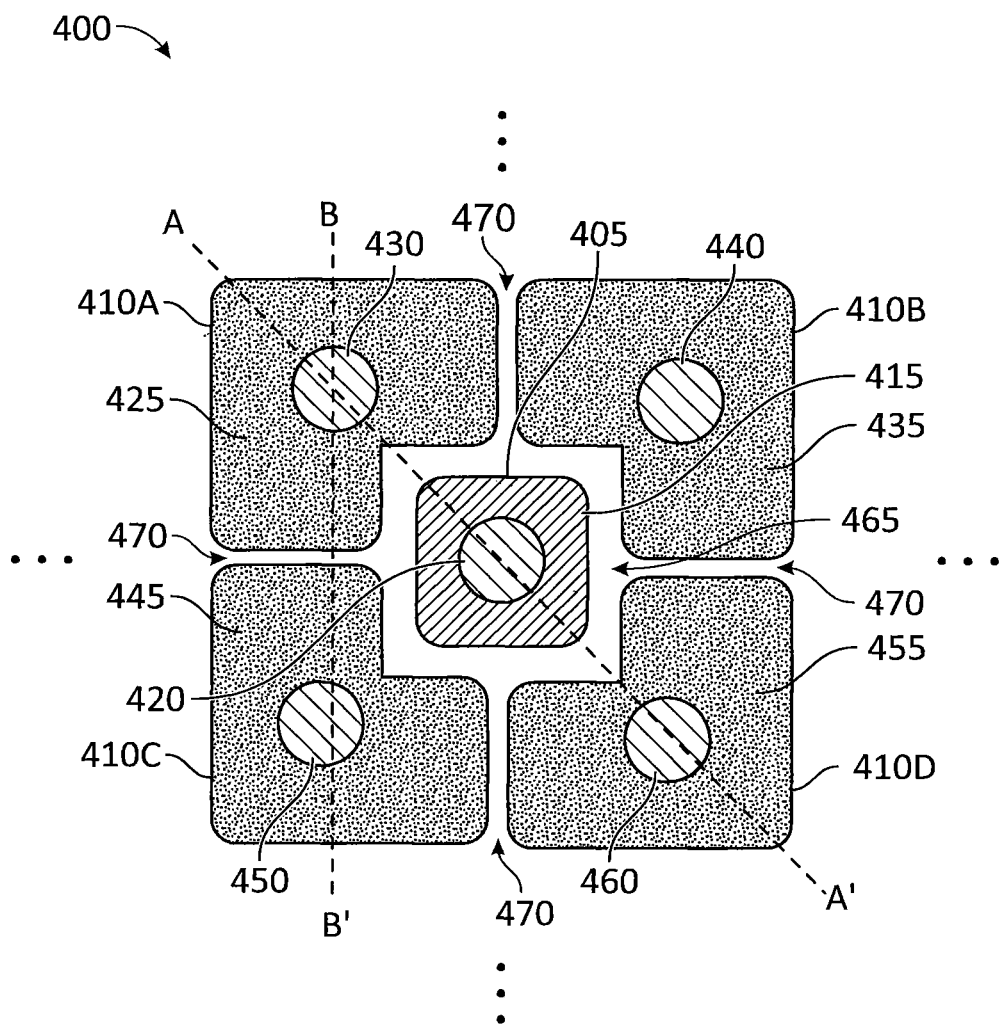
FIG. 4 illustrates a top-down view of an example macrocell in accordance with one or more embodiments of the present disclosure.
Figure 5A:
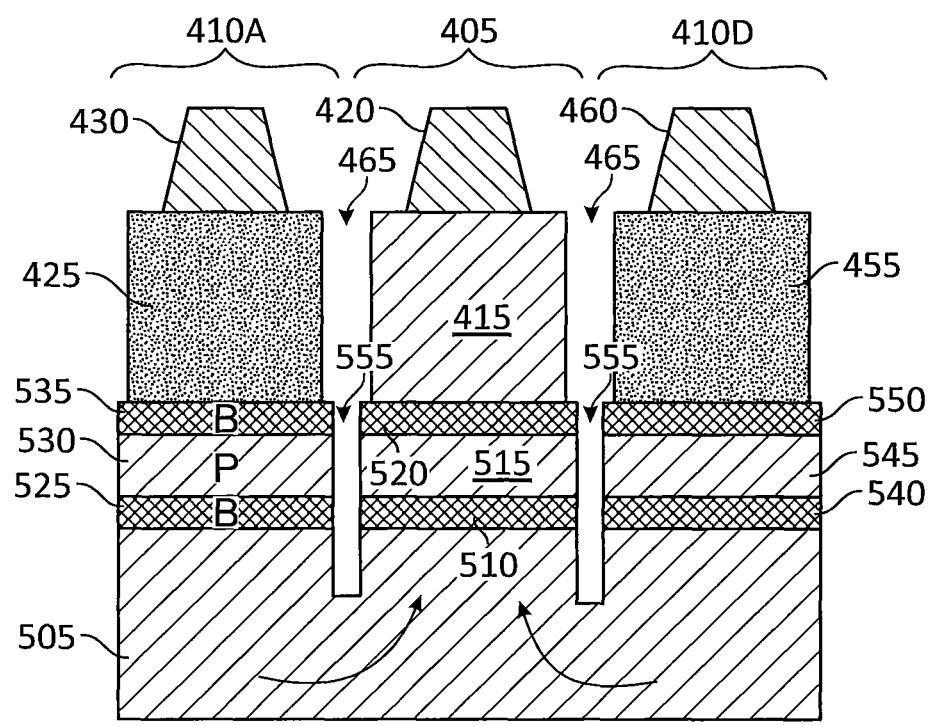
FIG. 5A illustrates an example cross-sectional side view of the macrocell taken along a plane formed by a line A-A' identified in FIG. 4 in accordance with one or more embodiments of the present disclosure.
Figure 5B:
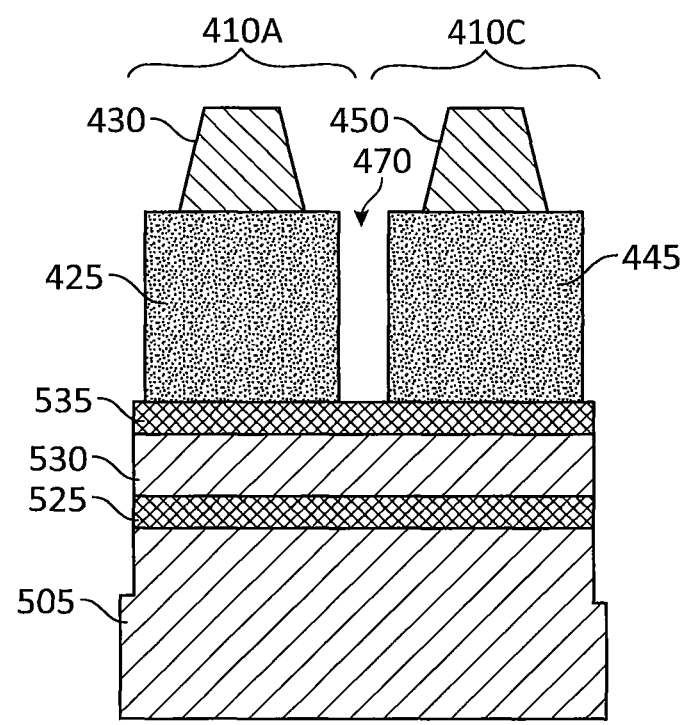
FIG. 5B illustrates an example cross-sectional side view of the macrocell taken along a plane formed by a line B-B' identified in FIG. 4 in accordance with one or more embodiments of the present disclosure.

FIG. 4 illustrates a top-down view of an example macrocell 400 in accordance with one or more embodiments of the present disclosure. FIG. 5A illustrates a cross-sectional side view of the macrocell 400 taken along a plane formed by a line A-A' identified in FIG. 4 in accordance with one or more embodiments of the present disclosure. FIG. 5B illustrates a cross-sectional side view of the macrocell 400 taken along a plane formed by a line B-B' identified in FIG. 4 in accordance with one or more embodiments of the present disclosure.

The macrocell 400 includes a Band 1 pixel 405 and Band 2 pixels 410A-D that surround the Band 1 pixel 405. As such, in the macrocell 400, a ratio of a number of Band 2 pixels to a number of Band 1 pixels is 4:1. As an example, Band 1 may be a SWIR waveband and Band 2 may be a LWIR waveband. As another example, Band 1 may be a waveband in a portion of the visible-light spectrum and Band 2 may be a waveband in another portion of the visible-light spectrum and/or a portion of the IR spectrum. As shown in FIG. 5A, the Band 1 pixel 405 includes layers 505 (e.g., a portion of the layer 505) and 415 having a first conductivity type (e.g., n-type), a layer 515 having a second conductivity type (e.g., p-type), barrier layers 510 and 520, and a detector contact 420. The Band 2 pixel 410A includes the layer 505 (e.g., a portion thereof), a layer 425 having the first conductivity type, a layer 530 having the second conductivity type, and barrier layers 525 and 535. The Band 2 pixel 410D includes the layer 505 (e.g., a portion thereof), a layer 455 having the first conductivity type, a layer 545 having the second conductivity type, and barrier layers 540 and 550. As shown in FIG. 5B, the Band 2 pixel 410C includes the layers 505, 530, and 445 and the barrier layers 525 and 535. The top-down view of FIG. 4 shows a top surface of the layers 415, 425, 435, 445, and 455; a top surface of the detector contacts 420, 430, 440, 450, and 460; the gaps 465 between the Band 1 pixel 405 and the Band 2 pixels 410A-D; and the gaps 470 between adjacent Band 2 pixels 410A-D. In an aspect, gaps may also be referred to as openings, cavities, holes, vias, or recesses. In some cases, as shown in FIGS. 4, 5A, and/or 5B, the detector contacts 420, 430, 440, 450, and 460 are each a top-most interconnect on the detector mesa of the pixels 405, 410A, 410B, 410C, and 410D, respectively. In some cases, the detector contacts 420, 430, 440, 450, and 460 may be utilized to couple with corresponding contacts of the readout circuit.

Gaps 465 and 555 separate a portion of the Band 1 pixel 405 from a portion of the Band 2 pixels 410A-D. For example, in FIG. 5A, the gaps 465 separate the layers 415, 425, and 455. The gaps 555 separate the layers 510/515/520 of the Band 1 pixel 405 from the layers 525/530/535 and the layers 540/545/550 of the Band 2 pixels 410A and 410D, respectively. The layers 535 and 550 are electrically connected, whereas the layer 520 is disjoint from the layers 535 and 550. The layers 530 and 545 are electrically connected, whereas the layer 515 is disjoint from the layers 530 and 545. The layers 525 and 540 are electrically connected, whereas the layer 510 is disjoint from the layer 510. In an aspect, the layers 535 and 550 may be portions of a continuous layer, the layers 530 and 545 may be portions of a continuous layer, and the layers 525 and 520 may be portions of a continuous layer. The gaps 555 also partially separate the layer 505. Gaps 470 separate a portion of adjacent Band 2 pixels. For example, in FIG. 5B, a gap 470 separates the layer 425 of the Band 2 pixel 410A from the layer 445 of the Band 2 pixel 410C. The gaps 465, 470, and 555 may be formed by etching operations (e.g., wet etch, dry etch), drilling operations, or generally any appropriate operations to remove material to define (e.g., delineate) the Band 1 pixel 405, the Band 2 pixels 410A-D, and any other pixels not shown in FIGS. 4, 5A, and 5B. In this regard, such operations may be performed to form the gaps 465, 470, and 555 to partially isolate the pixels 405, 410A-D, etc. In some cases, the Band 1 pixel 405 and Band 2 pixels 410A-D may be referred to as mesa structures, detector mesas, pillars, posts, or variants thereof. The detector contacts 420, 430, and 460 may be referred to as a top-most interconnection of the mesa structure. In some cases, delineation of the pixels (e.g., formed of epitaxially grown semiconductor layers) may minimize spatial cross-talk.

With reference to FIG. 5A, the Band 1 pixel 405 (and other Band 1 pixels of the detector array not shown in FIGS. 4, 5A, and 5B) positioned in the center of the macrocell 400 is delineated through (e.g., delineated entirely through) the layers 415, 520, 515, and 510 and partially delineated through the layer 505. As such, the Band 1 pixel 405 is delineated through its top-most junction and partially through its bottom-most junction. By delineating entirely through the layers 415, 520, 515, and 510, the layers 415, 520, 515, and 510 are disjoint from corresponding layers in other Band 1 pixels and Band 2 pixels.

The Band 2 pixels 410A-B (and other Band 2 pixels of the detector array not shown in FIGS. 4, 5A, and 5B) may be delineated through the layers 425 and 455 (e.g., top-most absorber layer). The cross-sectional side view of FIG. 5A shows the gap 555 extending through the layers 535/530/525/505 of the Band 2 pixel 410A and the layers 550/545/540/505 of the Band 2 pixel 410B. The cross-sectional side view of FIG. 5B shows that the layers 535, 530, 525, and 505 for the Band 2 pixels 410A and 410C are not separated by any gap. In some cases, as a variation to FIG. 5B, a gap may delineate at least a portion of the layer 535, the layer 535 and at least a portion of the barrier layer 530, the layers 535 and 530 and at least a portion of the layer 525, or the layers 535, 530, and 525 and a portion of the layer 505 (e.g., as shown in FIG. 5A).

In some cases, having the layer 505 (e.g., bottom-most absorber layer) partially continuous between the Band 1 pixel 405 and the Band 2 pixels 410A-B (e.g., and other Band 1 pixels and Band 2 pixels not shown in FIGS. 4, 5A, and 5B) may allow transport of photogenerated carriers by diffusion from the layer 505 to the detector contact 420 via transport through the layers 505, 510, 515, 520, and 415 (e.g., as shown by the arrows in FIG. 5A). Such continuity provided by the layer 505 may facilitate electrical connection/continuity of the bottom-most layers of the Band 1 pixels and Band 2 pixels, as further described herein. For example, the layer 505 provides a larger area that facilitates lateral collection of photogenerated carriers.

In an embodiment, for Band 1 pixels, gaps extend entirety through a top-most layer (e.g., the layer 415) and both barrier layers (e.g., 510 and 520) and extend partially through a bottom-most layer (e.g., the layer 505). As such, for Band 1 pixels, the top-most layer (e.g., the layer 415), middle layer (e.g., the layer 515), and barrier layers (e.g., the barrier layers 520 and 510) of the Band 1 pixels (e.g., the Band 1 pixel 405) are disjoint from corresponding layers of other Band 1 pixels and Band 2 pixels. For Band 2 pixels, gaps extend entirety through a top-most layer (e.g., to define the layers 425 and 455). Optionally, the gaps for the Band 2 pixels may extend down through one or more of the barrier layers (or portion thereof) or portion of the bottom-most layer while maintaining continuity between the middle layers of the Band 2 pixels (e.g., the layers 530 and 545). In this regard, the gaps may penetrate one or both barrier layers (e.g., in some spatial locations) while not isolating the middle layers completely. In an aspect, for a given Band 2 pixel (e.g., the Band 2 pixel 410A), the top-most layer (e.g., the layer 425) of the Band 2 pixel is disjoint from the top-most layer of the other Band 2 pixels. The middle layer (e.g., the layer 530) and the barrier layers (e.g., the barrier layers 535 and 525) of the given Band 2 pixel may be continuous with the corresponding layers of other Band 2 pixels. Such continuity of the layers for the Band 2 pixels may facilitate electrical continuity of the middle layers (e.g., the layer 515) of the Band 2 pixels, as further described herein.

The macrocell 400 may be repeated to form a detector array (e.g., of an FPA). In this regard, the detector array may be referred to as including an array of macrocells, with each macrocell including an arrangement of Band 1 pixels and Band 2 pixels. In FIG. 4, the ellipses to the left, right, above, and below the macrocell 400 indicate that one or more additional macrocells or no macrocells are provided to the left, right, above, or below, respectively, the macrocell 400. In some cases, by having more Band 2 pixels than Band 1 pixels, the detector array may have a higher resolution for data (e.g., image data) within the waveband detected/captured by the Band 2 pixels than for data within the waveband detected/captured by the Band 1 pixels. It is noted that the 4:1 ratio of Band 2 pixels to Band 1 pixels is provided by way of non-limiting example. Other ratios, such as 3:1, 1:4, 1:2, or 1:1, may be utilized. Further in this regard, the number of pixels in a macrocell may be any number equal to or greater than two (e.g., at least one Band 1 pixel and at least one Band 2 pixel).

Figure 6A:
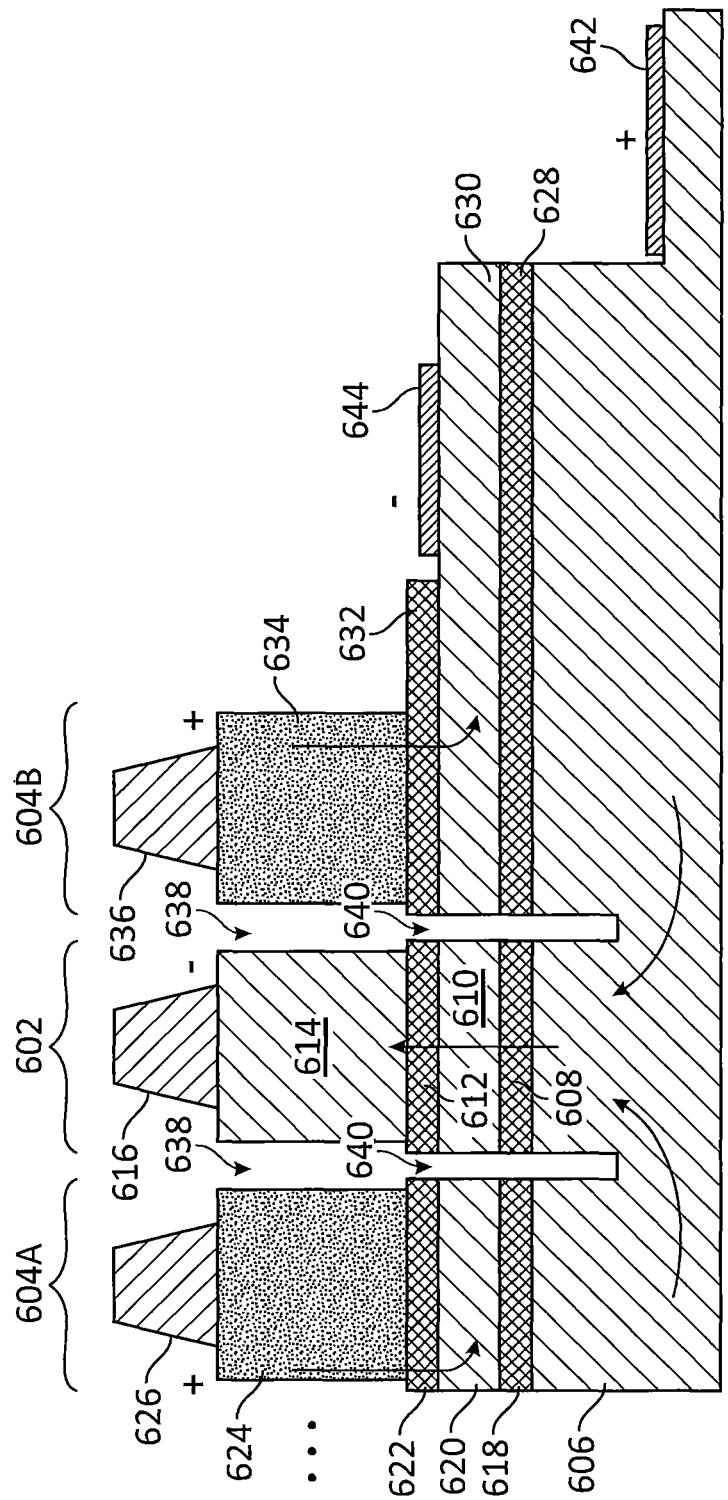
FIGS. 6A and 6B illustrate example cross-sectional side views of pixels and associated ground contacts in accordance with one or more embodiments of the present disclosure.

FIG. 6A illustrates an example cross-sectional side view of a Band 1 pixel 602 and Band 2 pixels 604A and 604B and associated ground contacts 642 and 644 in accordance with one or more embodiments of the present disclosure. The pixels 602 and 604A-B may form a portion of a detector array. The detector array may include more Band 1 pixels and/or more Band 2 pixels in addition to the pixels 602 and 604A-B shown in FIG. 6A. In FIG. 6A, the ellipses indicate that the detector array includes one or more additional pixels (e.g., Band 1 pixels and/or Band 2 pixels) or no additional pixel. In an embodiment, the Band 1 pixel 602, the Band 2 pixel 604A, and the Band 2 pixel 604B may be the Band 1 pixel 405, the Band 2 pixel 410A, and the Band 2 pixel 410B, respectively, of FIG. 4.

The Band 1 pixel 602 includes layers 606 (e.g., portion thereof) and 614 having a first conductivity type, a layer 610 having a second conductivity type, barrier layers 608 and 612, and a detector contact 616. The Band 2 pixel 604A includes the layer 606 (e.g., portion thereof), a layer 624 having the first conductivity type, a layer 620 having the second conductivity type, barrier layers 618 and 622, and a detector contact 626. The Band 2 pixel 604B includes the layer 606 (e.g., portion thereof), a layer 634 having the first conductivity type, a layer 630 having the second conductivity type, barrier layers 628 and 632, and a detector contact 636.

Gaps 638 and 640 separate the pixels 602 and 604A-B. The gaps 638 separate the layers 614, 624, and 634 of the pixels 602, 604A, and 604B, respectively. The gaps 640 separate the layers 608/610/612, 618/620/622, and 628/630/632 of the pixels 602, 604A, and 604B, respectively. In some aspects, the layers 614, 624, and 634 may be separated such that they are disjoint (e.g., non-continuous) from each other. The layers 608, 610, and 612 of the Band 1 pixel 602 may be disjoint from the corresponding layers 618, 620, and 622 of the Band 2 pixel 604A and the corresponding layers 628, 630, and 632 of the Band 2 pixel 604B. In some aspects, the layers 618, 620, and 622 of the Band 2 pixel 604A may be partially separated from the corresponding layers 628, 630, and 632 of the Band 2 pixel 604B, while each layer remains part of a respective continuous layer to facilitate electrical continuity. For example, the layers 620 and 630 of the pixels 604A and 604B, respectively, may each form part of a continuous layer having the second conductivity type. The barrier layers 618 and 628 of the Band 2 pixels 604A and 604B, respectively, may each form part of a first continuous barrier layer. The barrier layers 622 and 632 of the Band 2 pixels 604A and 604B, respectively, may each form part of a second continuous barrier layer. Continuity of the layer 606 facilitates electrical connection/continuity of each of the pixels 602 and 604A-B with the ground contact 642. Continuity of the layers 620 and 630 facilitates electrical connection/continuity of the Band 2 pixels 604A-B with the ground contact 644.

The ground contacts 642 and 644 are provided to facilitate readout of image data for both Band 1 pixels and Band 2 pixels. Connections may be established between the ground contacts 642 and 644 and detector contacts of the pixels 602, 604A-B, and other pixels of the detector array not shown in the cross-sectional side view of FIG. 6A. Connections may be established between the pixels 602 and 604A-B with the ground contact 642. As shown in FIG. 6A, the layer 606 is a continuous layer (e.g., continuous semiconductor layer) having the first conductivity type. The layer 606 facilitates continuous electrical coupling between the pixels 602 and 604A-B and the ground contact 642. Connections may be established between the Band 2 pixels 604A-B with the ground contact 644. In an aspect, while the layers 620 and 630 are shown as separated in the cross-sectional side view, the layers 620 and 630 of the Band 2 pixels 604A-B form a part of a continuous layer (e.g., continuous semiconductor layer) to allow a continuous electrical coupling between the Band 2 pixels 604A-B and the ground contact 644. The continuous nature of the layers 620 and 630 may be shown in other cross-sections of the Band 2 pixels 604A-B (e.g., such as shown with regard to the Band 2 pixels 410A and 410C in FIG. 5B).

The ground contact 642 may be provided on, partially within, or otherwise at a position in contact with the continuous layer formed by the layer 606. The ground contact 642 may be provided on, partially within, or otherwise at a position in contact with the continuous layer formed at least by the layers 620 and 630. The ground contacts 642 and 644 are disjoint from each other to prevent shorting out each other. In some aspects, the ground contacts 642 and 644 may be situated at a periphery of the detector array. In these aspects, the ground contacts 642 and 644 are shared by the pixels 602 and 604A-B (and other pixels) of the detector array, allowing conservation of die real estate relative to a case in which a respective pair of ground contacts is provided for each pixel. In an aspect, the ground contact 642 may provide a common ground plane for Band 1 pixels and the ground contact 644 may provide a common ground plane for Band 2 pixels. In some cases, the Band 1 pixels (e.g., the layers 608, 610, 612, and 614 of the Band 1 pixel 602) may be provided as a standalone pillar that is smaller relative to the Band 2 pixels so that a current pathway goes around the Band 1 pixels to the ground contact 644. In some cases, the Band 1 pixels and Band 2 pixels are provided with a honeycomb shape. While the foregoing provides embodiments in which the ground contacts 642 and 644 are shared by the pixels, in other embodiments, multiple pairs of ground contacts may be provided for pixels of a detector array. For example, in one case, each pixel may have its own respective pair of ground contacts.

As an example, a first continuous layer (e.g., formed by the layer 606) may be a continuous n-type layer, a second continuous layer (e.g., formed at least in part by the layers 620 and 630) may be a continuous p-type layer, and the layers 614, 624, and 634 may be disjoint (e.g., non-continuous, fully separated, fully reticulated) n-type layers having the detector contacts 616, 626, and 636, respectively, disposed thereon. The first continuous layer facilitates electrical connection/connectivity between each of the pixels 602 and 604A-B (and other pixels of the detector array not shown in FIG. 6A) and the contact 642. The second continuous layer facilitates electrical connection/connectivity between each of the Band 2 pixels 604A-B (and other Band 2 pixels of the detector array not shown in FIG. 6A) and the contact 644. The detector contact 616 of the Band 1 pixel 602 (and corresponding detector contacts of other Band 1 pixels) may be connected to the ground contact 642. The detector contacts 626 and 636 of the Band 2 pixels 604A and 604B, respectively, (and corresponding detector contacts of other Band 2 pixels) may be connected to the ground contact 644. The layer 606 and the layers 610, 620, and 630 form an np junction of the pixels 602, 604A, and 604B, respectively, and the layers 610, 620, and 630 and the layers 614, 624, and 634 form a pn junction of the pixels 602, 604, and 604B, respectively. As such, each of the pixels 602 and 604A-B has an npn back-to-back diode stack structure. In this example, the ground contact 642 may be referred to as an N ground or N contact, and the ground contact 644 may be referred to as a P ground or P contact.

With continued reference to the pixels 602 and 604A-B having an npn structure, in some embodiments, to facilitate simultaneous read out of Band 1 pixels and Band 2 pixels, each junction of each of the pixels 602 and 604A-B (and other pixels of the detector array not shown in FIG. 6A) may be reverse biased. In some aspects, to achieve simultaneity, each junction is reverse biased continuously in time. To implement such biasing for the Band 1 pixel 602, a reverse bias may be applied on the Band 1 pixel 602 between the detector contact 616 on the detector mesa of the Band 1 pixel 602 and the ground contact 642 (e.g., N contact). In this regard, a bias is applied across the back-to-back diode stack structure of the Band 1 pixel 602. Because the junctions for the two wavebands are stacked back-to-back, such biasing results in a reverse bias applied on the bottom pn diode formed by the layers 606 and 610 and a forward bias applied to the top np diode formed by the layers 610 and 614. The reverse bias applied on the Band 1 pixel 602 causes a higher potential at the ground contact 642 (e.g., depicted as a positive (+) sign at the ground contact 642) and a lower potential at the detector contact 616 (e.g., depicted as a negative (−) sign at the detector contact 616). As shown by the arrows from the layer 606 to the layer 614 in FIG. 6A, the combination of the reverse biased bottom diode and the forward biased top diode allows photogenerated minority holes to flow from the ground contact 642 to the detector contact 616. Such photogenerated minority holes may flow through the layer 606 (e.g., n-type absorber layer), the barrier layer 608, the layer 610, the barrier layer 612, and the layer 614 to the detector contact 616.

To implement such biasing for the Band 2 pixel 604A, a reverse bias may be applied on the Band 2 pixel 604A between the detector contact 626 on the detector mesa of the Band 2 pixel 604A and the ground contact 644 (e.g., P contact). A similar bias may be applied on the Band 2 pixel 604B between the detector contact 636 on the detector mesa of the Band 2 pixel 604B and the ground contact 644. The reverse bias applied on the Band 2 pixels 604A and 604B causes a higher potential at the detector contacts 626 and 636 (e.g., depicted as a positive (+) sign at the detector contacts 626 and 636) of the Band 2 pixels 604A and 604B, respectively, and a lower potential at the ground contact 644 (e.g., depicted as a negative (−) sign at the ground contact 644). As shown by the arrow from the layer 624 to the layer 620 in FIG. 6A, for the Band 2 pixel 604A, by applying the reverse bias between the detector contact 626 and the ground contact 644, photogenerated minority holes may flow from the detector contact 626 to the ground contact 644. Such photogenerated minority holes may flow through the layer 624 (e.g., n-type absorber layer), the barrier layer 622, and the layer 620 to the ground contact 644. Similarly, for the Band 2 pixel 604B, photogenerated minority holes may flow from the detector contact 636 to the ground contact 644. Such photogenerated minority holes may flow through the layer 634 (e.g., n-type absorber layer), the barrier layer 632, and the layer 630 to the ground contact 644.

By utilizing such biasing techniques, photogenerated charges may be collected on a charge well of a readout circuit (e.g., ROIC) for both wavebands and read out in the same frame. In this regard, image data for both wavebands are read out as part of the same frame. The flow of the photogenerated minority holes provides a photocurrent that can be read out by the readout circuit. The photocurrent is indicative of a light signal received by the pixels. Having image data for both wavebands read out as part of every frame is in contrast to a case of sequential readout of image data of the two wavebands. In sequential readout, readout of image data of each waveband may be modulated in time. For example, image data for a first waveband may be read out for a first frame, image data for a second waveband may be read out for a second frame subsequent to readout for the first frame, image data for the first waveband may be read out for a third frame, image data for the second waveband may be read out for a fourth frame subsequent to readout for the third frame, and so forth. In some cases, interconnects for readout for both Band 1 pixels (e.g., the Band 1 pixel 602) and Band 2 pixels (e.g., the Band 2 pixels 604A-B) may be situated spatially on the same plane to facilitate hybridization to the readout circuit (e.g., ROIC).

Figure 6B:
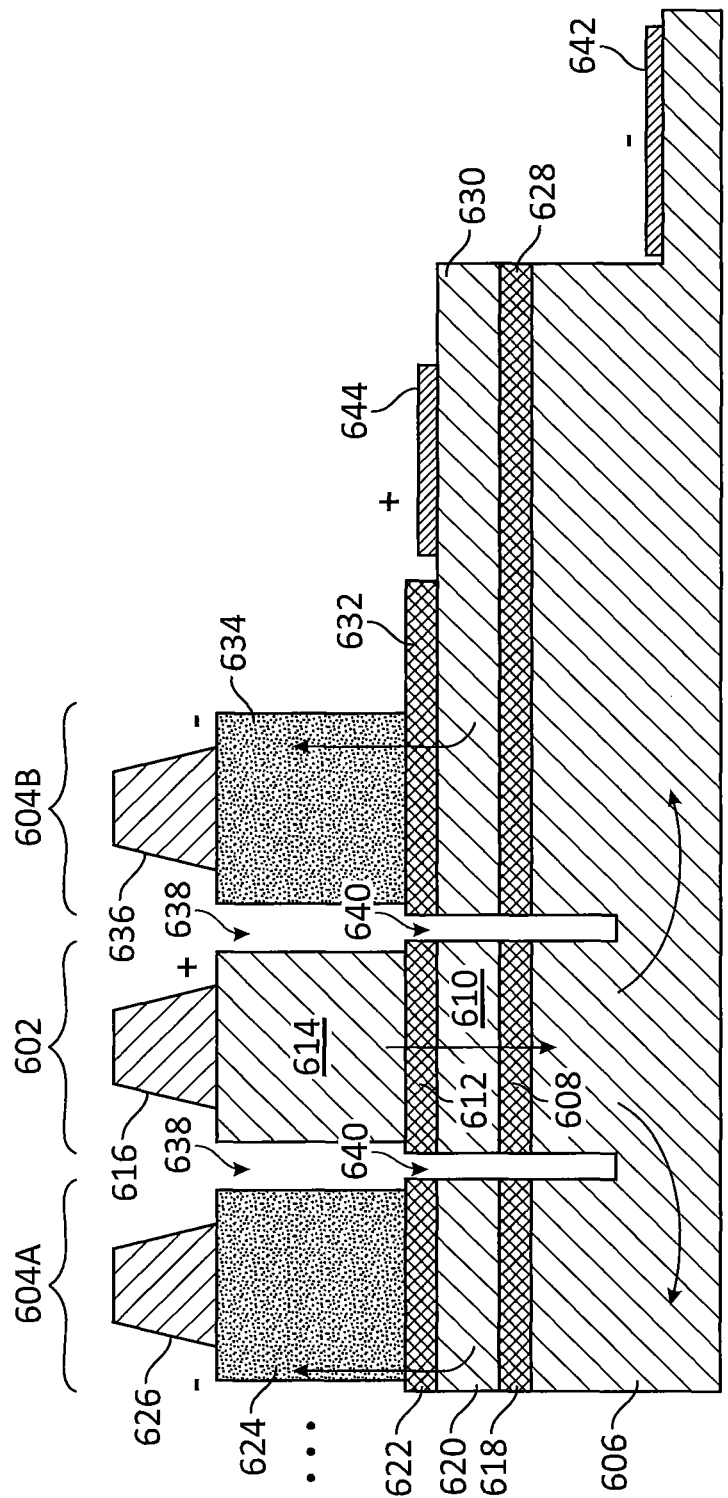

FIG. 6B illustrates an example cross-sectional side view of the Band 1 pixel 602 and the Band 2 pixels 604A and 604B and the associated ground contacts 642 and 644 in accordance with one or more embodiments of the present disclosure. The description of FIG. 6A generally applies to FIG. 6B, with examples of differences between FIG. 6A and FIG. 6B and other description provided herein. In an aspect, biasing illustrated in FIG. 6B is opposite that illustrated in FIG. 6A and corresponding flow of holes is in an opposite direction of that illustrated in FIG. 6A.

As an example, in FIG. 6B, the pixels 602 and 604A-B may have a pnp structure, with the biasing illustrated in FIG. 6B being utilized to facilitate simultaneous readout of Band 1 pixels and Band 2 pixels. In the case that the pixels 602 and 604A-B have a pnp structure, a first continuous layer (e.g., formed by the layer 606) may be a continuous p-type layer, a second continuous layer (e.g., formed at least in part by the layers 620 and 630) may be a continuous n-type layer, and the layers 614, 624, and 634 may be disjoint (e.g., non-continuous, fully separated, fully reticulated) p-type layers having the detector contacts 616, 626, and 636, respectively, disposed thereon. In some aspects, to achieve simultaneity, each junction of each of the pixels 602 and 604A-B (and other pixels of the detector array not shown in FIG. 6B) may be reverse biased. As shown in FIG. 6B, the reverse bias applied on the Band 1 pixel 602 causes a higher potential at the detector contact 616 and a lower potential at the ground contact 642. As shown by the arrows from the layer 614 to the layer 606 in FIG. 6B, the combination of the reverse biased bottom diode and the forward biased top diode allows holes to flow from the detector contact 616 to the ground contact 642, and allows photogenerated minority electrons to flow in the opposite direction from the flow of the holes. Such photogenerated minority electrons may flow through the layer 606 (e.g., p-type absorber layer), the barrier layer 608, the layer 610, the barrier layer 612, and the layer 614 to the detector contact 616.

The reverse bias applied on the Band 2 pixels 604A and 604B causes a higher potential at the ground contact 644 and a lower potential at the detector contacts 626 and 636. As shown by the arrow from the layer 620 to the layer 624 in FIG. 6B, for the Band 2 pixel 604A, by applying the reverse bias between the detector contact 626 and the ground contact 644, holes may flow from the ground contact 644 to the detector contact 626, and photogenerated minority electrons may flow from the detector contact 626 to the ground contact 644. Such photogenerated minority electrons may flow through the layer 624, the barrier layer 622, and the layer 620 to the ground contact 644. Similarly, for the Band 2 pixel 604B, photogenerated minority electrons may flow from the detector contact 636 to the ground contact 644. Such photogenerated minority electrons may flow through the layer 634, the barrier layer 632, and the layer 630 to the ground contact 644.

Figure 7:
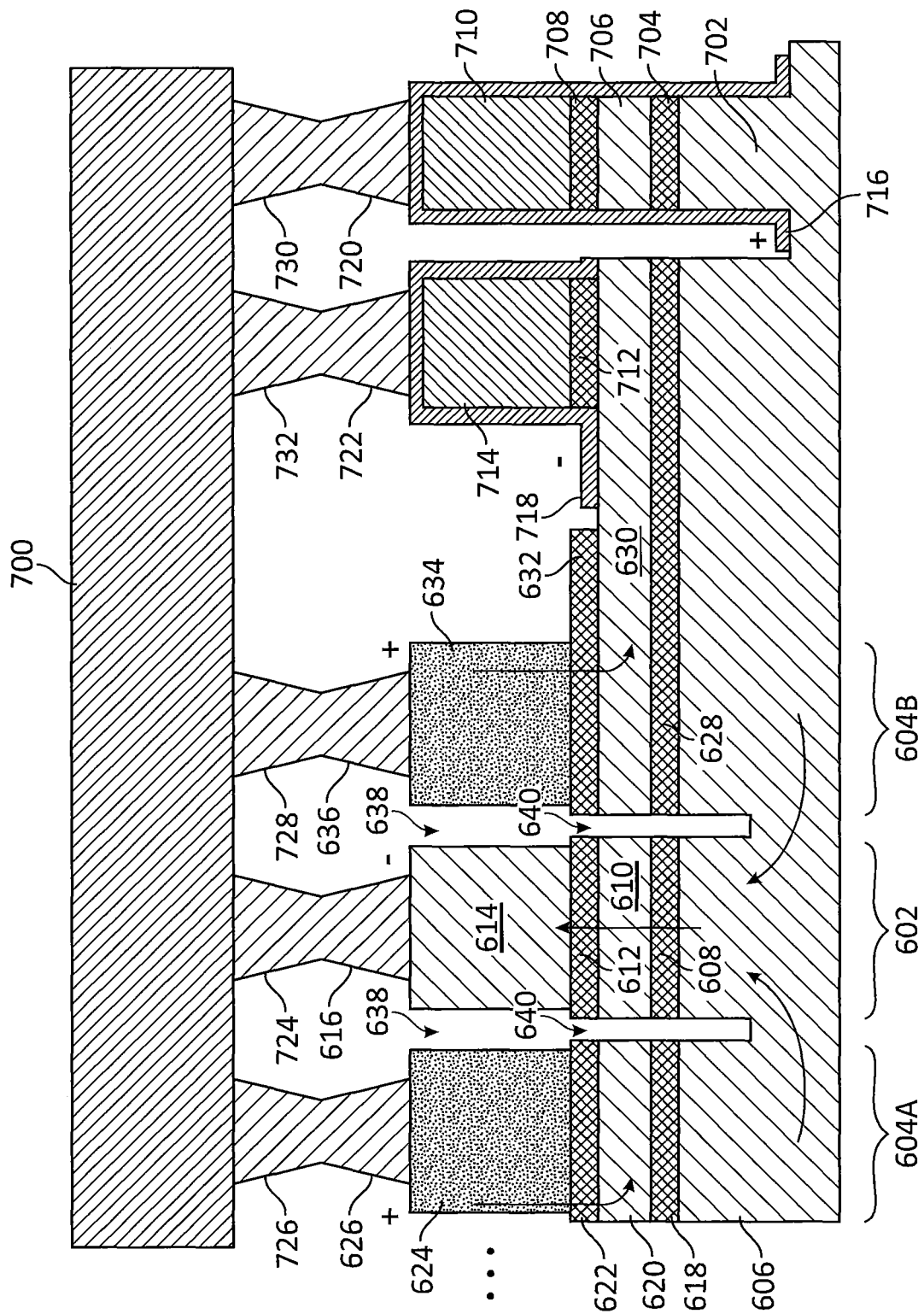
FIG. 7 illustrates an example cross-sectional side view of pixels, associated ground contacts, and a readout circuit in accordance with one or more embodiments of the present disclosure.

FIG. 7 illustrates an example cross-sectional side view of the Band 1 pixel 602 and the Band 2 pixels 604A and 604B, associated ground contacts, and a readout circuit 700 in accordance with one or more embodiments of the present disclosure. Although biasing and associated flow of holes in FIG. 7 are illustrated with reference to facilitating simultaneous readout for an npn structure (e.g., similar to FIG. 6A), biasing and associated flow of holes may be reversed to facilitate readout for a pnp structure (e.g., similar to FIG. 6B).

In accordance with one or more embodiments, FIG. 7 illustrates an example manner by which the pixels 602 and 604A-B are hybridized to (e.g., bonded to) the readout circuit 700. Ground contact mesas may be formed to facilitate connectivity to the readout circuit 700. A first ground contact mesa may include layers 702, 704, 706, 708, and 710. A metal contact layer 716 may be deposited on top of the first ground contact mesa. A second ground contact mesa may include layers 712 and 714. A metal contact layer 718 may be deposited on top of the second ground contact mesa. The metal contact layers 716 and 718 may encapsulate the first ground contact mesa and second ground contact mesa, respectively. Contacts 720 and 722 may be provided on the metal contact layers 716 and 718, respectively. The metal contact layer 716 and the contact 720 electrically connect the layer 606 to the readout circuit 700. The metal contact layer 718 and the contact 722 electrically connect the layers 610, 620, and 630 (e.g., the continuous middle layer) to the readout circuit 700. The metal contact layers 716 and 718 are disjoint from each other to prevent shorting out each other. In an aspect, the metal contact layers 716 and 718 may be formed along a periphery of the detector array to facilitate connection of the pixels to the metal contact layers 716 and 718. In an embodiment, the first ground contact mesa, the metal contact layer 716, and the contact 720 may collectively provide the ground contact 642 of FIGS. 6A and 6B. The second ground contact mesa, the metal contact layer 718, and the contact 722 may collectively provide the ground contact 644 of FIGS. 6A and 6B.

As shown in FIG. 7, the readout circuit 700 may include contacts 724, 726, 728, 730, and 732 to connect to the contacts 616, 626, 636, 720, and 722, respectively. In another aspect, rather than separate contacts provided on the pixels 602 and 604A-B, the readout circuit 700, and the metal contact layers 716 and 718, an entirety of a contact may be provided on the pixels 602 and 604A-B, the metal contact layers 716 and 718, and/or the readout circuit 700. For example, the contacts 626 and 726 associated with the Band 2 pixel 704A may be a single contact provided on a surface of the layer 624 or on a surface of the readout circuit 700. In some cases, bias voltages may be provided by the readout circuit 700 on the pixels 602 and 604A-B and the metal contact layers 716 and 718.

To form the detector mesas and ground contact mesas, in an embodiment, a first layer of material may be etched to define the layers 606 and 702, a second layer of material may be etched to define the layers 608, 618, 628, and 704, a third layer of material may be etched to form the layers 610, 620, 630, and 706, a fourth layer of material may be etched to form the layers 612, 622, 632, 708, and 712, and a fifth layer of material may be etched to form the layers 614, 624, 634, 710, and 714. In some cases, the detector mesas and the ground contact mesas may be formed during the same etching operations or, alternatively, during separate etching operations. In one case, the first and/or second ground contact mesas may be continuous mesas formed along the periphery of the detector array to facilitate connection of the detector array to the readout circuit 700. In another case, the first and/or second ground contact mesas may each be one of a plurality of islands formed along (e.g., distributed along) the periphery of the detector array to facilitate connection of the detector array to the readout circuit 700. The metal contact layers 716 and 718 encapsulate the first and second ground contact mesas, respectively, and each form a continuous metallic layer along the periphery of the detector array.

Figure 8:
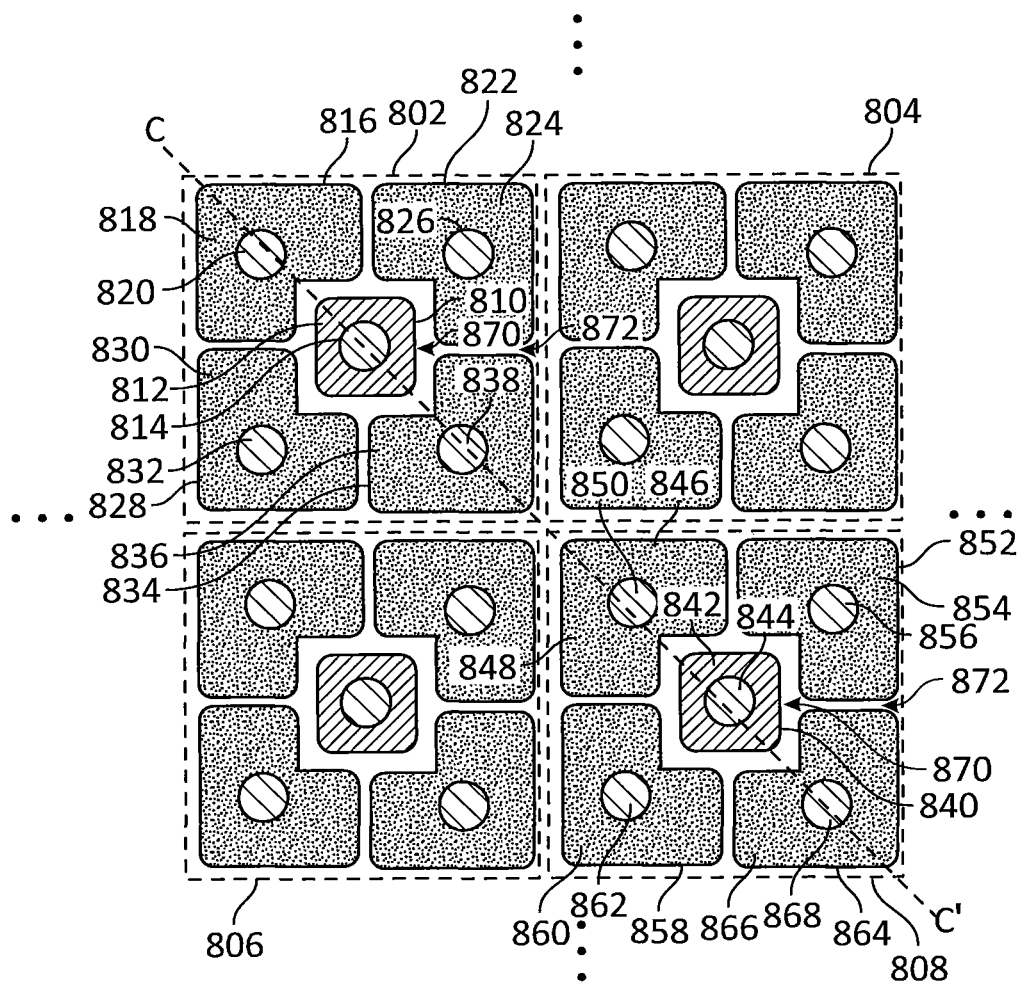
FIG. 8 illustrates a top-down view of an example array of macrocells in accordance with one or more embodiments of the present disclosure.
Figure 9:
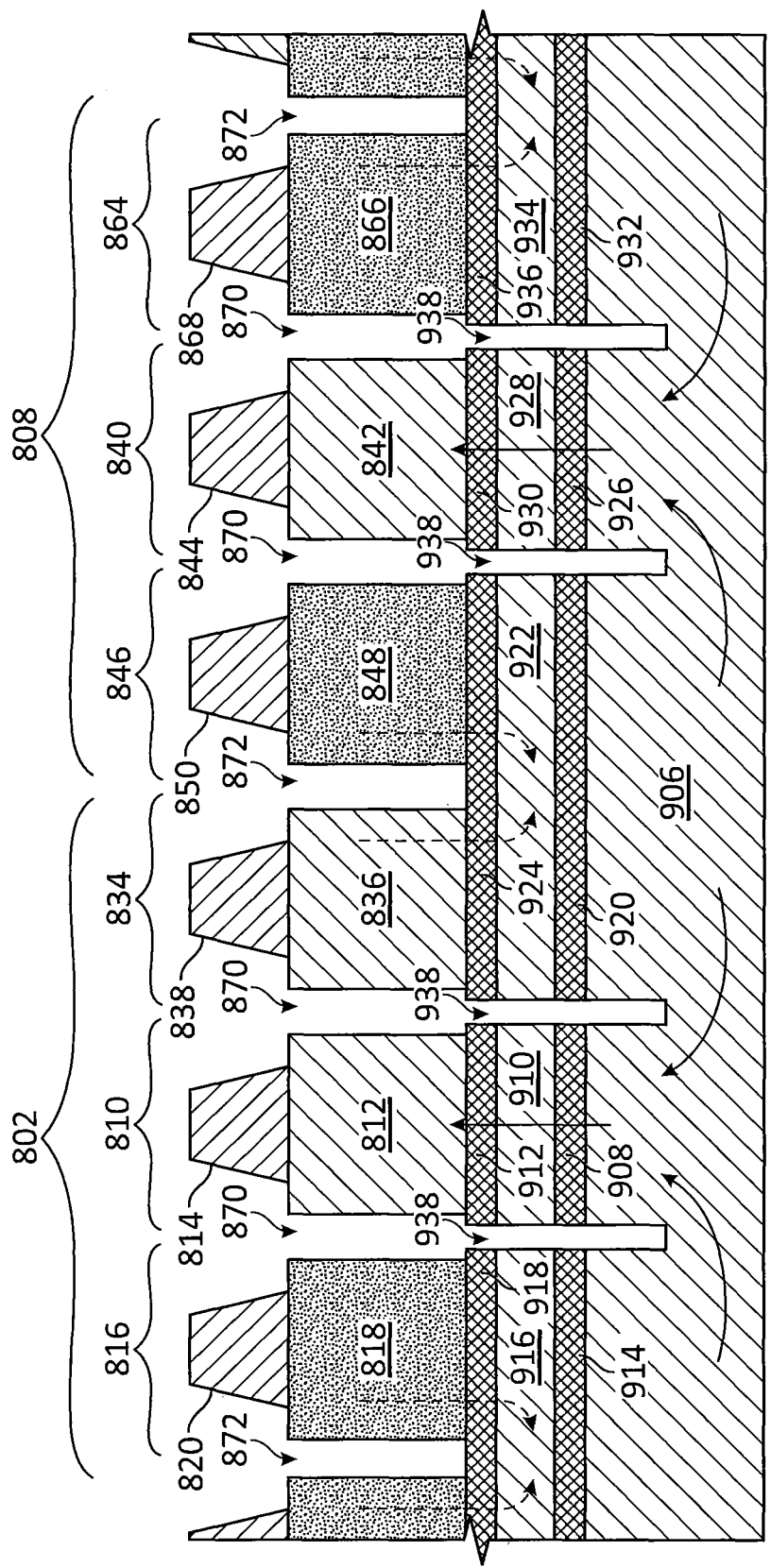
FIG. 9 illustrates an example cross-sectional side view of the 2×2 array of macrocells of FIG. 8 taken along a plane formed by a line C-C' identified in FIG. 8 in accordance with one or more embodiments of the present disclosure.

FIG. 8 illustrates a top-down view of a 2×2 array of macrocells (e.g., including macrocells 802, 804, 806, and 808) in accordance with one or more embodiments of the present disclosure. It is noted the dotted box around each of the macrocells is illustrated to identify each of the macrocells for explanatory purposes. The 2×2 array of macrocells may form at least a portion of a detector array, in which the ellipses indicate that the detector array may include one or more additional macrocells not shown in FIG. 8 or no additional macrocell. FIG. 9 illustrates a cross-sectional side view of the 2×2 array of macrocells of FIG. 8 taken along a plane formed by a line C-C' identified in FIG. 8 in accordance with one or more embodiments of the present disclosure.

The macrocell 802 includes Band 1 pixel 810 and Band 2 pixels 816, 822, 828, and 834. The Band 1 pixel 810 includes layers 906 (e.g., portion thereof) and 812 having a first conductivity type, layer 910 having a second conductivity type, and barrier layers 908 and 912. The Band 2 pixel 816 includes the layer 906 (e.g., portion thereof), a layer 818 having the first conductivity type, a layer 916 having the second conductivity type, and barrier layers 914 and 918. The Band 2 pixel 834 includes the layer 906 (e.g., portion thereof), a layer 836 having the first conductivity type, a layer 922 having the second conductivity type, and barrier layers 920 and 924. The Band 2 pixels 822 and 828 include similar stacked layers.

The macrocell 808 includes Band 1 pixel 840 and Band 2 pixels 846, 852, 858, and 864. The Band 1 pixel 840 includes the layer 906, a layer 842 having the first conductivity type, a layer 928 having the second conductivity type, and the barrier layers 926 and 930. The Band 2 pixel 846 includes the layer 906, a layer 848 having the first conductivity layer, a layer 922 having the second conductivity type, and the barrier layers 920 and 924. The Band 2 pixel 864 includes the layer 906, a layer 866 having the first conductivity layer, a layer 934 having the second conductivity layer, and barrier layers 932 and 936. As shown in FIG. 9, a periphery of each macrocell (e.g., the macrocells 802 and 808) is not delineated through the layer 922 to retain electrical continuity to a ground contact (e.g., the ground contact 644), which may be provided at a periphery of the detector array. Such delineation may be referred to as a partial delineation of the macrocell boundary and may be performed so as not to completely isolate each macrocell electrically to the ground contact.

Figure 10:
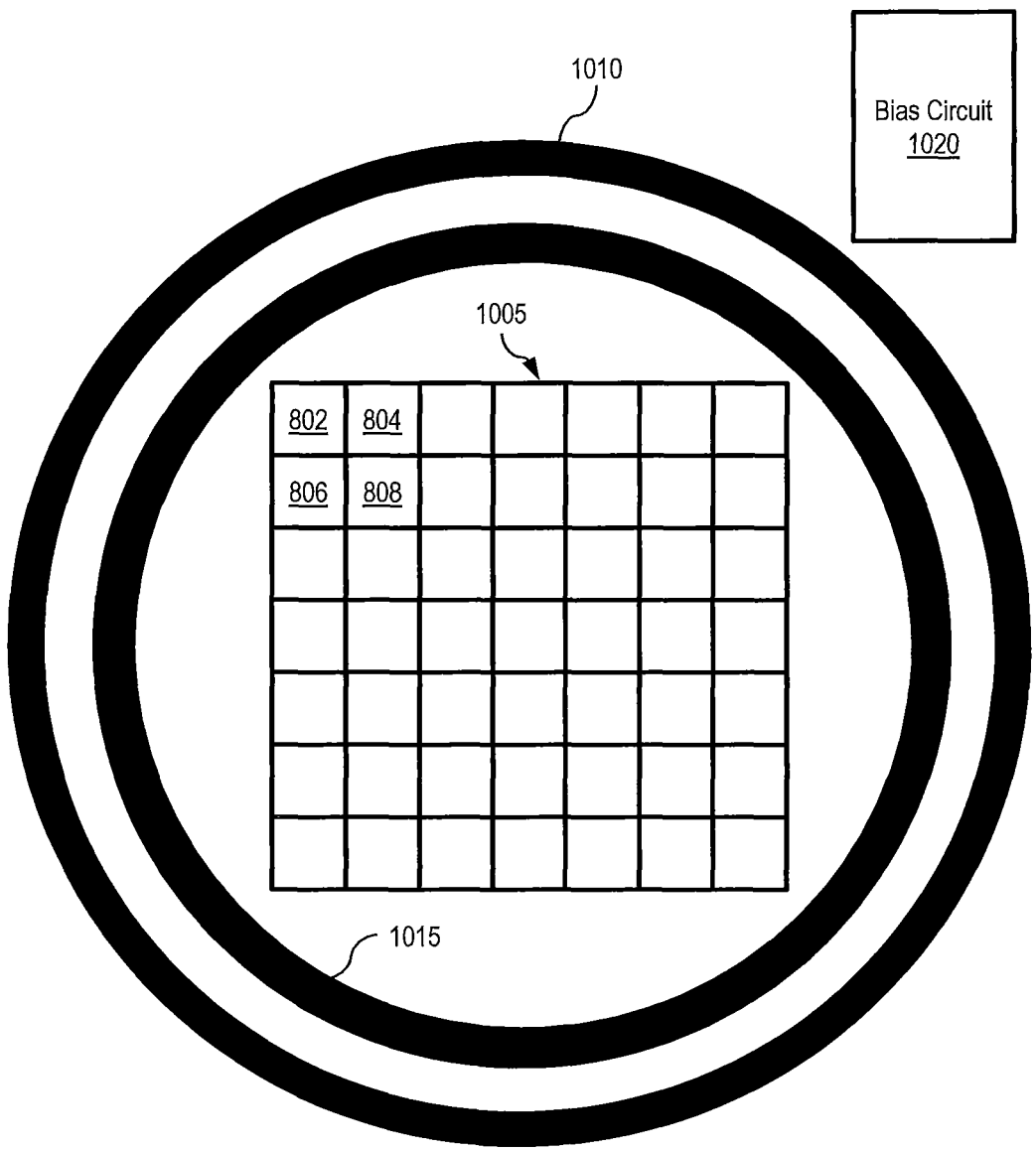
FIG. 10 illustrates a top-down view of a detector array and associated circuitry for facilitating applying of bias in accordance with one or more embodiments of the present disclosure.

FIG. 10 illustrates a top-down view of a detector array 1005 and associated circuitry for facilitating applying of bias in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the detector array 1005 may be, may include, or may be a part of the image detector circuit 165 of FIG. 1.

The detector array 1005 includes the macrocells 802, 804, 806, and 808 of FIG. 8 along with additional macrocells. Ground contacts 1010 and 1015 are provided along a periphery of the detector array 1005. While the ground contacts 1010 and 1015 are shown as circular rings in FIG. 10, the ground contacts 1010 and/or 1015 may have other shapes (e.g., triangular rings, rectangular rings, or other non-circular rings). In an embodiment, the ground contact 1010 may be the ground contact 642 of FIGS. 6A and 6B for electrically coupling a bottom-most layer of the Band 1 pixels and Band 2 pixels, and/or the ground contact 1015 may be the ground contact 644 of FIGS. 6A and 6B for electrically coupling a middle layer (e.g., middle layer between two barrier layers) of the Band 2 pixels. As one example implementation, the ground contacts 1010 and 1015 may include the metal contact layers 716 and 718, respectively, formed along the periphery of the detector array 1005.

A bias circuit 1020 may establish connection between detector contacts (e.g., 814, 820) of the Band 1 pixels and the Band 2 pixels of the macrocells of the detector array 1005 and the ground contacts 1010 and 1015 and apply appropriate biasing (e.g., to facilitate simultaneous readout of Band 1 image data and Band 2 image data). In an embodiment, the bias circuit 1020 may be, may include, or may be a part of the control bias and timing circuitry 235 of FIG. 2. In some cases, a readout circuit may include the bias circuit 1020.

Figure 11:
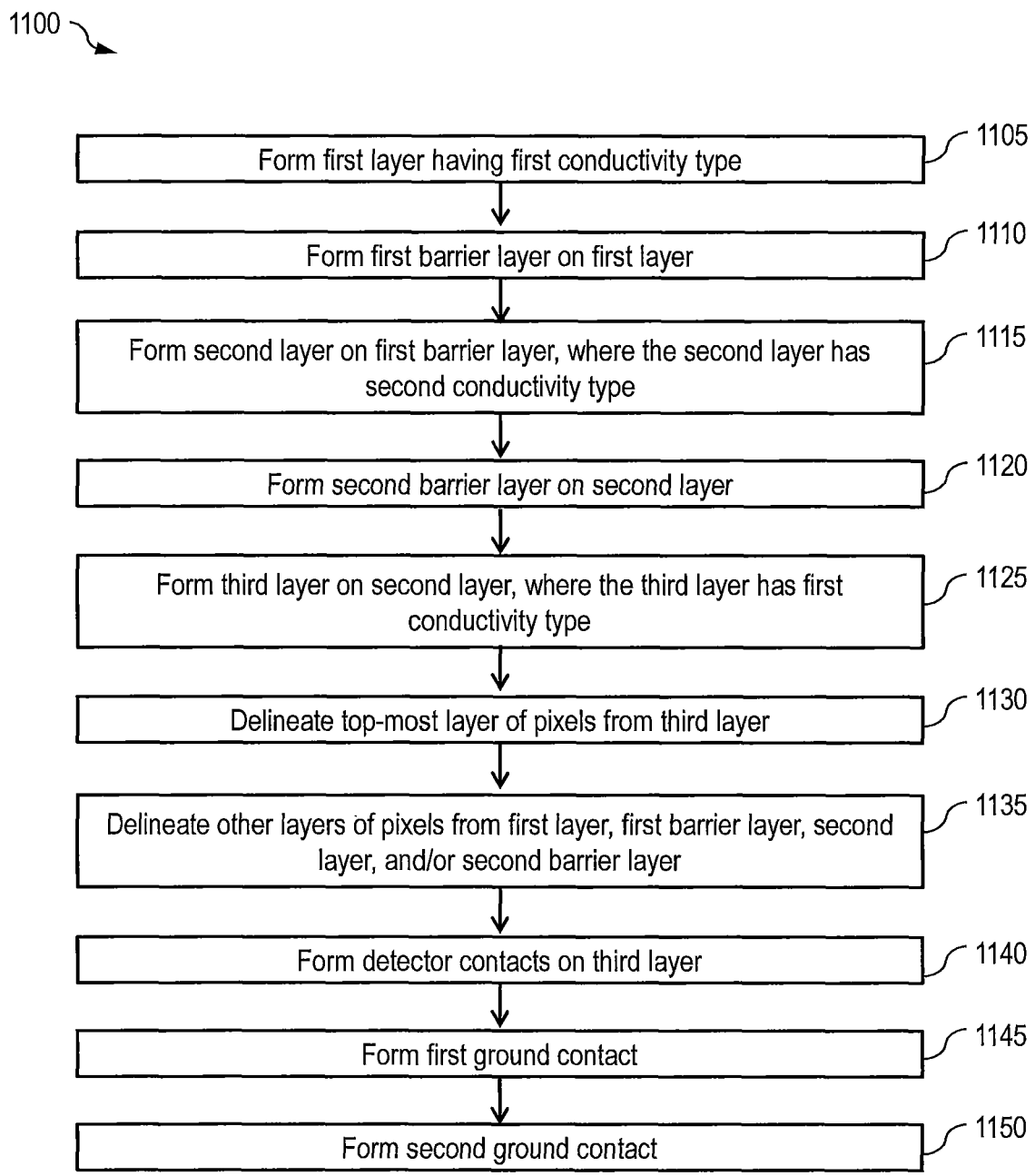
FIG. 11 illustrates a flow diagram of an example process for forming an imaging device in accordance with one or more embodiments of the present disclosure.

FIG. 11 illustrates a flow diagram of an example process 1100 for forming (e.g., fabricating) an imaging device in accordance with one or more embodiments of the present disclosure. The imaging device includes a detector array and a readout circuit. For explanatory purposes, the process 1100 is primarily described herein with reference to FIGS. 8 and 12A through 12H. In this regard, the detector array includes at least the Band 1 pixels 810 and 840 and at least the Band 2 pixels 816, 834, 846, and 864. However, the process 1100 can be performed in relation to other imaging devices. Note that one or more operations in FIG. 11 may be combined, omitted, and/or performed in a different order as desired.

FIGS. 12A through 12H illustrate cross-sectional side views as pixels (e.g., Band 1 pixels, Band 2 pixels) are formed in accordance with one or more embodiments of the present disclosure. In an embodiment, the cross-sectional side views of FIGS. 12A through 12H may be cross-sectional side views taken along a plane formed by the line C-C' identified in FIG. 8 as an array of pixels (e.g., including the pixels 810, 816, 822, 828, 834, 840, 846, 852, 858, and 864).

Figure 12A:
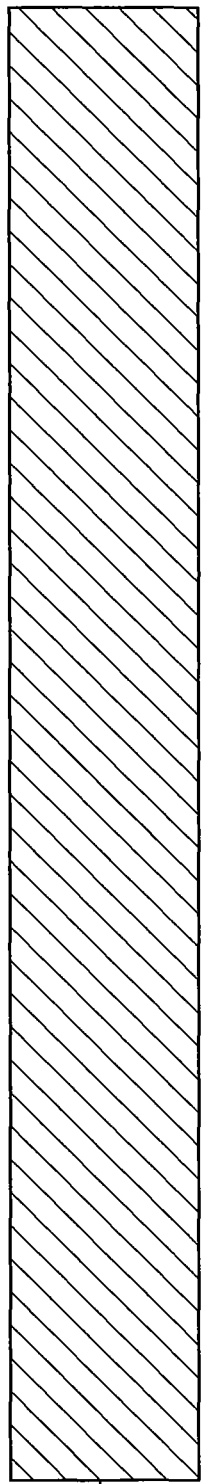
FIGS. 12A through 12H illustrate cross-sectional side views as pixels are formed in accordance with one or more embodiments of the present disclosure.
Figure 12B:
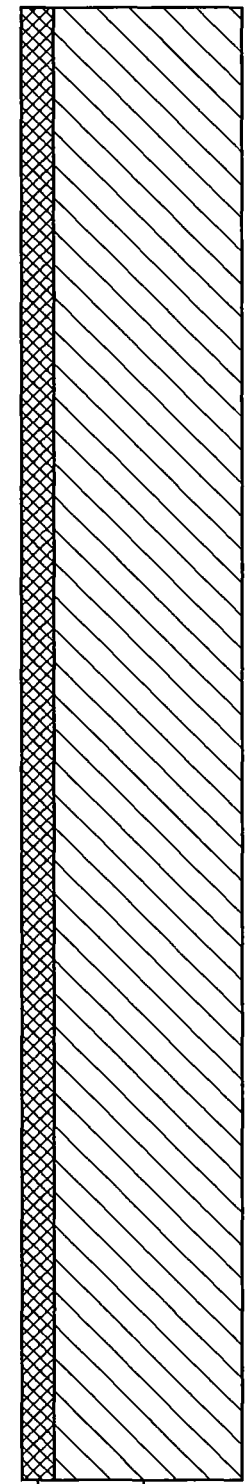
Figure 12C:
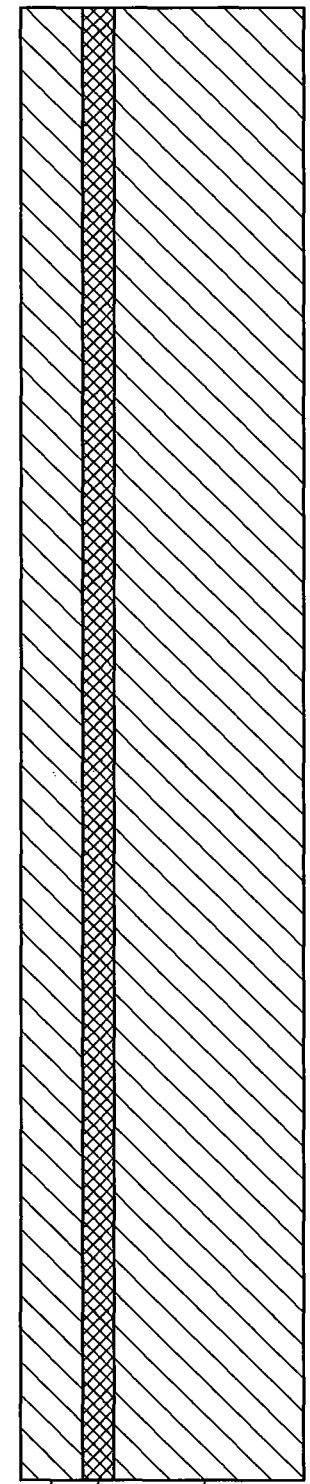
Figure 12D:
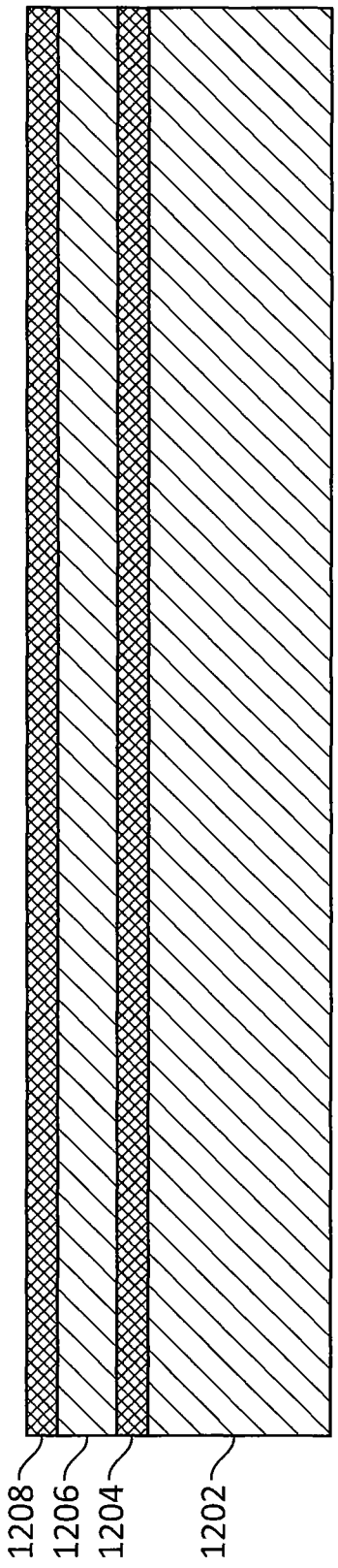
Figure 12E:
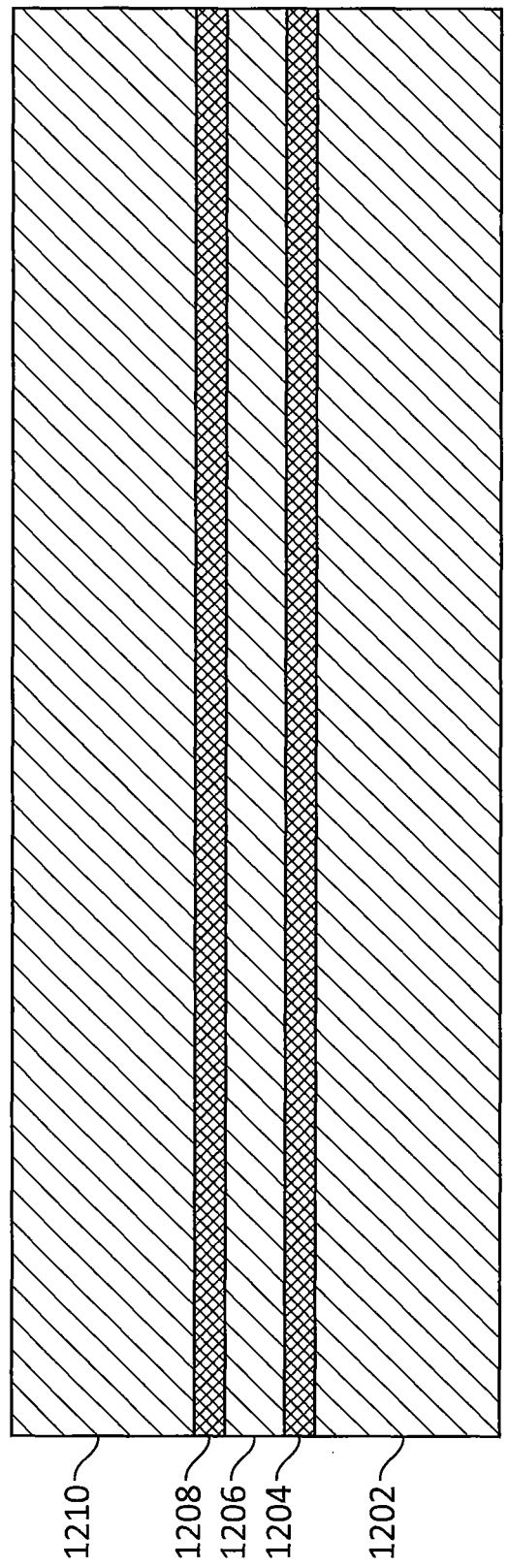

At block 1105, as shown in FIG. 12A, a layer 1202 having a first conductivity type is formed. At block 1110, as shown in FIG. 12B, a barrier layer 1204 is formed on the layer 1202. At block 1115, as shown in FIG. 12C, a layer 1206 having a second conductivity type is formed on the barrier layer 1204. At block 1120, as shown in FIG. 12D, a barrier layer 1208 is formed on the layer 1206. At block 1125, as shown in FIG. 12E, a layer 1210 having the first conductivity type is formed on the barrier layer 1208. For each of these layers, a given layer may be formed on top of another layer such that the given layer is disposed on and in contact with the other layer. In an aspect, the layers 1202, 1204, 1206, 1208, and/or 1210 may be epitaxially grown. Doping may be applied during or subsequent to the epitaxial growth. In some cases, the layer 1202 may be epitaxially grown on a support substrate (not shown).

In some aspects, the layers 1202, 1206, and 1210 may be implemented using bulk materials, SLSs, QWIPs, or MCT. As one non-limiting example, the layers 1202, 1206, and/or 1210 may be a bulk material, such as InP, InGaAs, InAs, or InAsSb. Alternatively or in addition, as an non-limiting example, the layers 1202, 1206, and/or 1210 may be a superlattice, such as an InAs/GaSb superlattice (e.g., a superlattice that alternates between a layer of InAs and a layer of GaSb) or an InAs/InAsSb superlattice. The barrier layers 1204 and 1208 may include AlSb, AlAsSb, AlGaAsSb, among others. The barrier layers 1204 and/or 1208 may be an n-type layer or a p-type layer. In an aspect, material for the barrier layers 1204 and 1208 are generally selected to block majority carriers that would otherwise be present in absorber layers and to not impede flow of photogenerated carriers. The layers 1202, 1206, and/or 1210 and/or the barrier layers 1204 and/or 1208 may be doped (e.g., intentionally and/or intrinsically). As one example, in an nBpBn structure, the barrier layers 1204 and/or 1208 may be a p-type layer. In another example, in a pBnBp structure, the barrier layers 1204 and/or 1208 may be an n-type layer.

Example doping concentrations of n-type layers, p-type layers, and barrier layers may be around from $10^{13}$ cm$^3$ to around $5 \times 10^{18}$ cm$^3$ dependent on application. Dopant choices are generally dependent on the material system associated with the n-type layers, the p-type layers, and the barrier layers. For example, in an InAs/GaSb superlattice, an example n-type dopant may be silicon and an example p-type dopant may be beryllium. In some cases, the barrier layers 1204 and 1208 may be utilized to minimize (e.g., reduce or eliminate) leakage current, such as generation-recombination current, and/or dark current. For example, the barrier layers 1204 and/or 1208 may have a wide bandgap. In this regard, appropriate material may be selected for the barrier layers 1204 and/or 1208 (e.g., in relation to the material system for the layers 1202, 1206, and 1210) based on desired parameters (e.g., minimum leakage current).

Figure 12F:
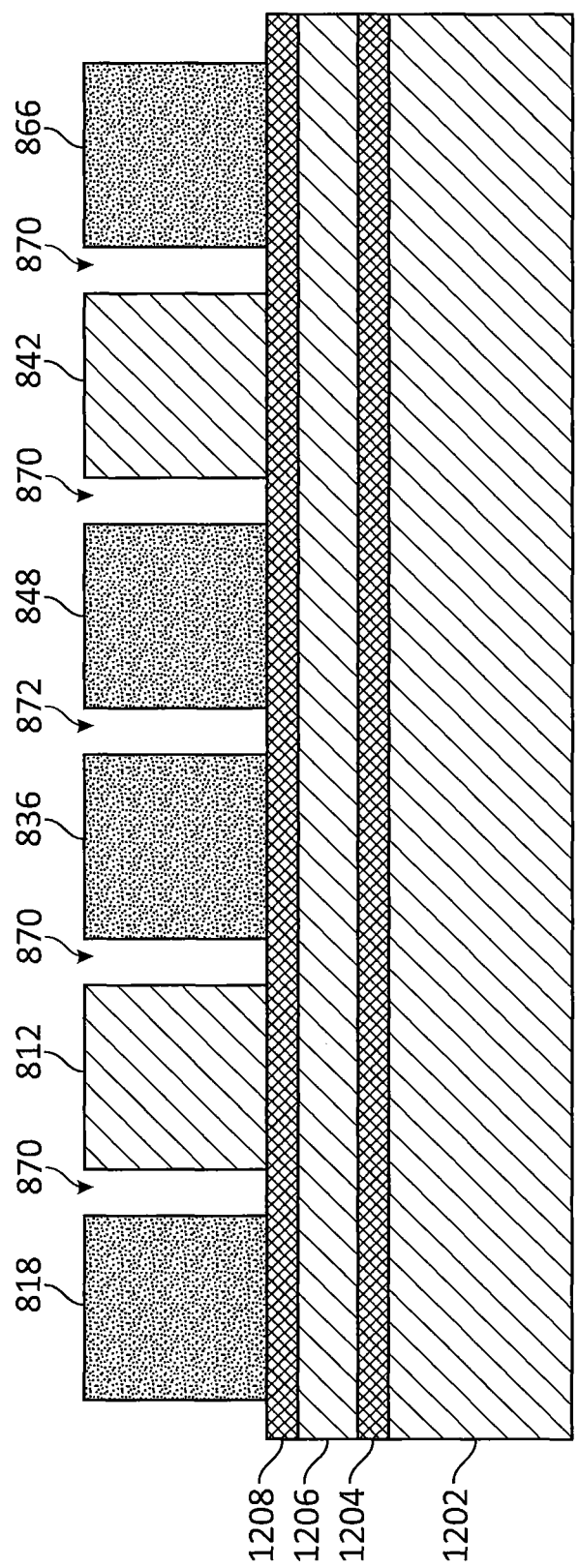

At block 1130, as shown in FIG. 12F, portions of the structure of FIG. 12E are removed to define (e.g., delineate) the layers 818, 812, 836, 848, 842, and 866 of the pixels 816, 810, 834, 846, 840, and 864, respectively, from the layer 1210. Removal of the portions forms the gaps 870 and 872. In an aspect, the layers 818, 812, 836, 848, 842, and 866 are discontinuous (e.g., disjoint) from each other, such that to increase electrical isolation between the layers 818, 812, 836, 848, 842, and 866. The portions of the layer 1210 may be removed by performing an operation, such as an etching operation, drilling operation, or other appropriate operation to remove material. In an aspect, to facilitate an etching operation, appropriate material(s) (e.g., hardmask and/or photoresist) (not shown in FIG. 12F) may be deposited on the layer 1210 and patterned using semiconductor fabrication techniques to define portions of the layer 1210 to be removed by the etching operation. The etching operation may then be performed to obtain the layers 818, 812, 836, 848, 842, and 866 (e.g., or equivalently to remove portions of the layer 1210 to form the gaps 870 and 872) according to the patterned material(s). The patterned material(s) may be removed as part of the etching operation or after the etching operation is complete.

Figure 12G:
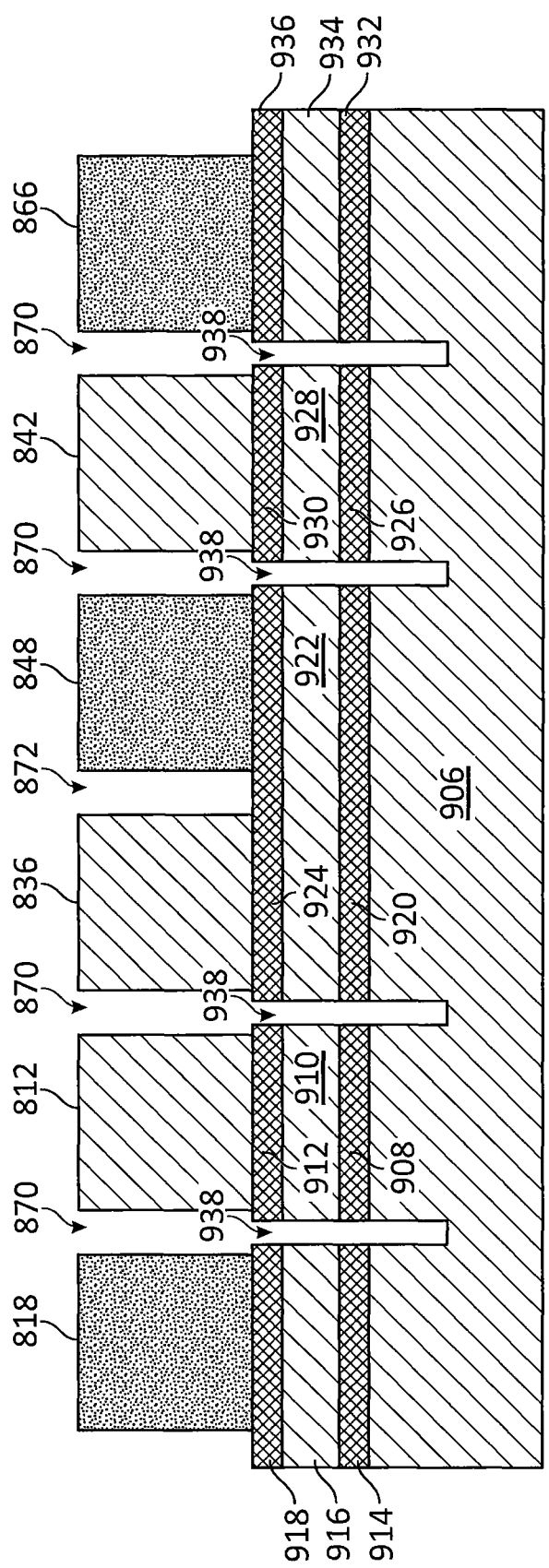

At block 1135, as shown in FIG. 12G, portions of the structure of FIG. 12F are removed to delineate the layers 910, 916, 922, 928, and 934 and the barrier layers 908, 912, 914, 918, 920, 924, 926, 930, 932, and 936 of the pixels 816, 810, 834, 846, 840, and 864 from the layers 1208, 1206, and 1204. Removal of the portions forms the gaps 938. In an aspect, one or more passivation layers may be formed. In an aspect, the passivation layer(s) may be utilized to suppress surface leakage that may otherwise be created by dangling bonds on the surface of the mesa that shunt the pn junction(s). For example, a passivation layer may be a conformal layer of dielectric material. In one case, a passivation layer may be added between block 1130 and 1135. In this regard, the passivation layer may be added after the gaps 870 and 872 are formed. After the passivation layer is added, the gaps 938 are formed. After the gaps 938 are formed, another passivation layer may be added. In another case, a passivation layer may be added after the gaps 870, 872, and 938 are formed, effectively utilizing one passivation for all exposed sidewall surfaces.

Figure 12H:
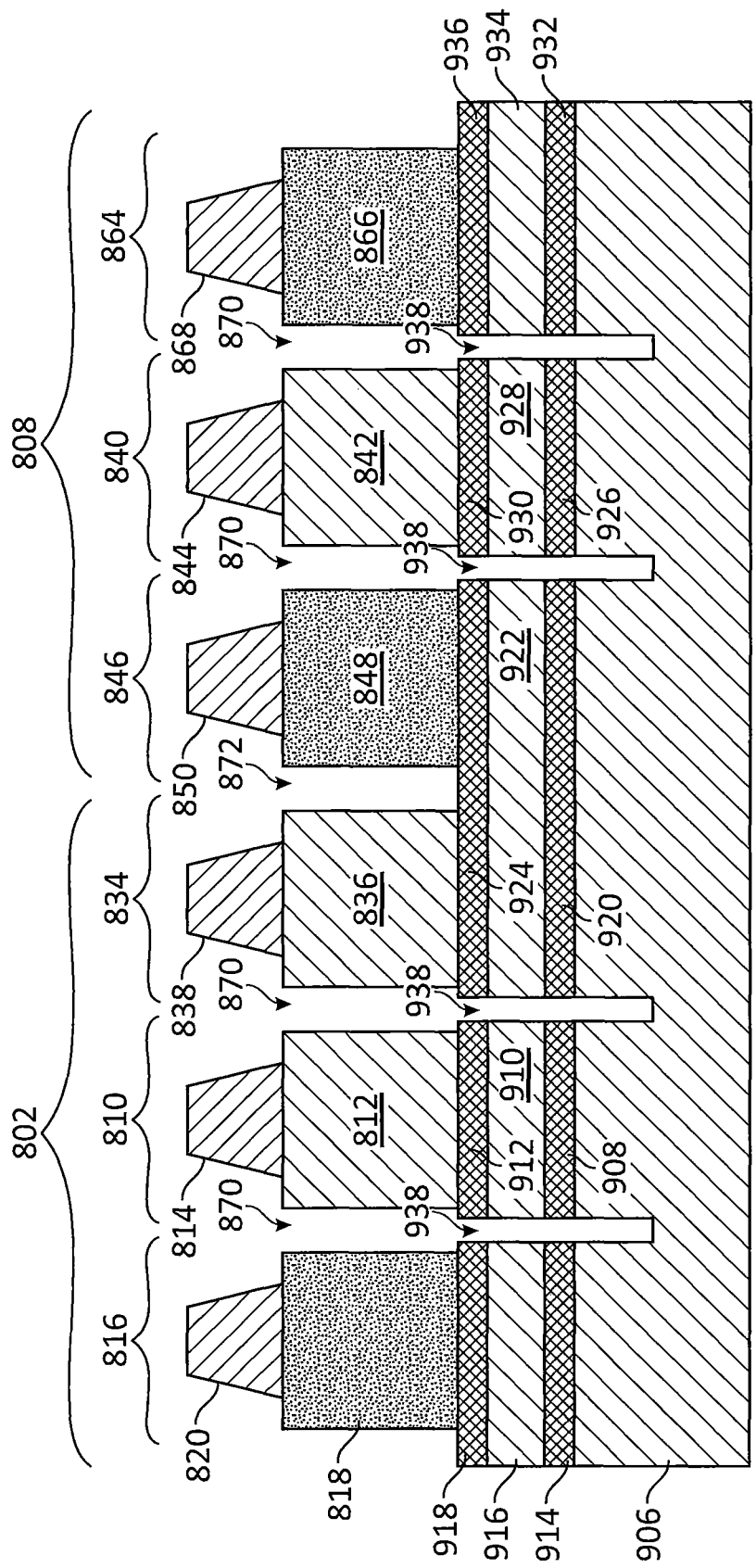

At block 1140, as shown in FIG. 12H, the detector contacts 820, 814, 838, 844, 850 and 868 are formed on the layers 818, 812, 836, 848, 842, and 866, respectively (e.g., a top surface of these layers). In an aspect, contact material may be deposited over the structure of FIG. 12G and patterned to form the contacts 820, 814, 838, 844, 850, and 868. In an aspect, the Band 1 pixels (e.g., the Band 1 pixels 810 and 840) and the Band 2 pixels (e.g., the Band 2 pixels 816, 834, 846, and 864) are collectively formed by performing blocks 1130, 1135, and 1140 (as depicted in FIGS. 12F-12H).

At block 1145, a first ground contact (e.g., the ground contact 642) is formed. At block 1150, a second ground contact (e.g., the ground contact 644) is formed. During operation of the imaging device that includes the pixels 816, 810, 834, 846, 840, and 864, the detector contacts 814 and 844 may be connected to the first ground contact and biased accordingly to facilitate readout of Band 1 image data captured by the pixels 810 and 840, respectively. The detector contacts 820, 838, 850, and 868 may be connected to the second ground contact and biased accordingly to facilitate readout of Band 2 image data captured by the pixels 816, 834, 846, and 864, respectively. In an embodiment, the readout circuit may simultaneously read out Band 1 image data and Band 2 image data.

In an embodiment, forming of the first and second ground contacts may include forming ground contact mesas and depositing metal contact layers over the ground contact mesas, such as described with respect to FIG. 7. For example, the ground contact mesas may be defined by removing portions of the layers 1202, 1204, 1206, 1208, and/or 1210. Such material removal may be effectuated by performing one or more material removal operations, such as etching operation(s), drilling operation(s), or other appropriate operation(s). In some cases, the ground contact mesas may be formed together with the detector mesas, such as when performing blocks 1130 and 1135. In other cases, separate material removal operation(s) may be performed to define the ground contact mesas. With the ground contact mesas defined, metal contact layers (e.g., 716 and 718) may be deposited over the ground contact mesas to form the first and second ground contacts. In some cases, contacts (e.g., 720, 722) may be provided on the metal contact layers such that the ground contact mesas, metal contact layers, and contacts collectively provide the ground contacts.

As previously indicated, the order of the operations in the process 1100 can be different from that provided above. For example, the Band 1 pixels may be delineated (e.g., by performing patterning and etching operations) and then the Band 2 pixels may be delineated, or vice versa. As another example, the detector contacts (e.g., 820, 814) may be defined prior to performing operations to remove material in (e.g., etch) one or more of the layers 1210, 1208, 1206, 1204, and/or 1202. In some cases, bumps for connecting the detector array to the readout circuit may be formed before or after operations are performed to delineate the Band 1 pixels and/or Band 2 pixels.

Although FIGS. 12A through 12H illustrates stacked detector structures having an nBpBn or a pBnBp structure, in some embodiments one or both barrier layers of each stacked detector structure may be omitted. For example, the layer 1206 may be formed on (e.g., disposed on and in contact with) the layer 1202, without the barrier layer 1204 having been formed on the layer 1202. Furthermore, while various layers of material are illustrated as a single layer of bulk material in FIGS. 12A through 12H (e.g., the layers 1202, 1204, 1206, etc.), each single layer may be implemented as one or multiple layers. For example, a single layer may represent a superlattice or other multiple layer structure.

Figure 13:
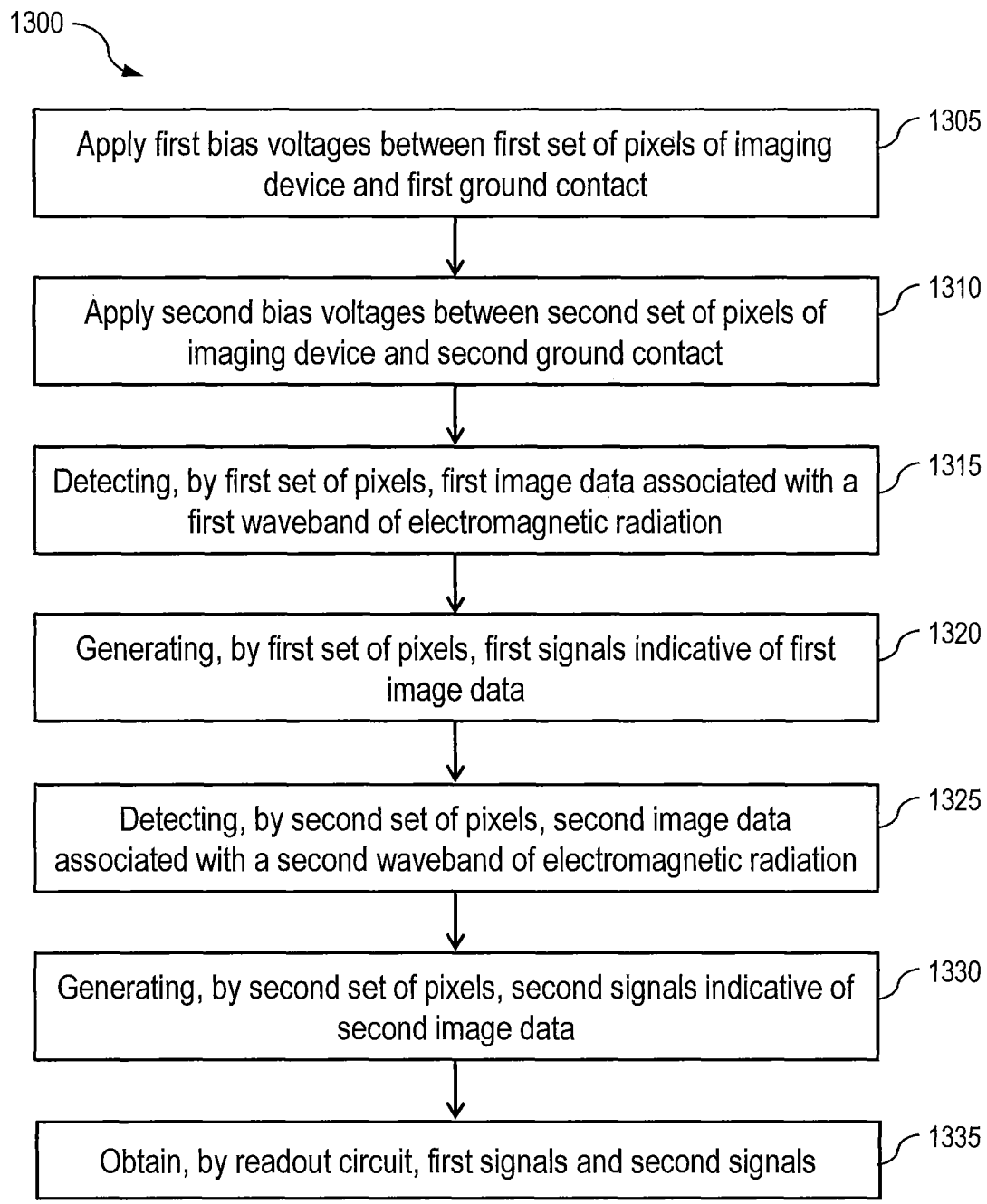
FIG. 13 illustrates a flow diagram of an example process for facilitating dual color detection during operation of an imaging device in accordance with one or more embodiments of the present disclosure.

FIG. 13 illustrates a flow diagram of an example process 1300 for facilitating dual color detection during operation of an imaging device in accordance with one or more embodiments of the present disclosure. The imaging device includes a detector array and a readout circuit. The process 1300 is primarily described herein with reference to FIGS. 8-10. In this regard, the detector array includes at least the Band 1 pixels 810 and 840 and at least the Band 2 pixels 816, 834, 846, and 864. However, the process 1300 can be performed in relation to other imaging devices. Note that one or more operations in FIG. 13 may be combined, omitted, and/or performed in a different order as desired. In an embodiment, the ground contact 1010 may be the ground contact 642 of FIGS. 6A and 6B, and the ground contact 1015 may be the ground contact 644 of FIGS. 6A and 6B. As one example implementation, the ground contacts 1010 and 1015 may include the metal contact layers 716 and 718, respectively, formed along the periphery of the detector array 1005.

At block 1305, the bias circuit 1020 applies bias voltages between Band 1 pixels (e.g., the Band 1 pixels 810 and 840) of the imaging device and the ground contact 1010. In an aspect, a reverse bias is applied between detector contacts (e.g., the detector contacts 814 and 844) of the Band 1 pixels and the ground contact 1010. For example, when the Band 1 pixels and Band 2 pixels have an npn structure (e.g., npn, nBpn, npBn, or nBpBn), by applying the bias voltages, a potential at the detector contacts is lower than a potential at the ground contact 1010. As another example, when the Band 1 pixels and Band 2 pixels have a pnp structure, by applying the bias voltages, a potential at the ground contact 1010 is lower than a potential at the detector contacts.

At block 1310, the bias circuit 1020 applies bias voltages between Band 2 pixels (e.g., the Band 2 pixels 816, 834, 846, and 864) of the imaging device and the ground contact 1015. In an aspect, a reverse bias is applied between detector contacts (e.g., the detector contacts 820, 814, 838, 850, 868) of the Band 2 pixels and the ground contact 1015. As one example, when the Band 1 pixels and Band 2 pixels have an npn structure, by applying the bias voltages, a potential at the detector contacts is higher than a potential at the ground contact 1015. As another example, when the Band 1 pixels and Band 2 pixels have a pnp structure, by applying the bias voltages, a potential at the ground contact 1015 is higher than a potential at the detector contacts.

At block 1315, the Band 1 pixels detect image data associated with a first waveband of incident EM radiation (e.g., associated with a scene). At block 1320, the Band 1 pixels generate signals indicative of the detected image data. In some aspects, the generated signals are electrical signals, such as voltage signals or current signals, and may be, may be derived into, or may be referred to as pixel values.

At block 1325, the Band 2 pixels detect image data associated with a second waveband of the EM radiation. At block 1330, the Band 2 pixels generate signals (e.g., electrical signals) indicative of the detected image data. In some aspects, the generated signals are electrical signals, such as voltage signals or current signals, and may be, may be derived into, or may be referred to as pixel values.

At block 1335, the readout circuit (e.g., the readout circuit 700) obtains the first signals from the Band 1 pixels and the second signals from the Band 2 pixels. In some aspects, the readout circuit simultaneously reads out the Band 1 pixels and the Band 2 pixels such that the first signals and second signals are obtained as part of a single frame. In an embodiment, with reference to FIG. 7, the detector array (e.g., including the Band 1 pixel 602 and the Band 2 pixels 604A-B) is hybridized to (e.g., coupled to, bonded to) the readout circuit 700 to allow the first signals and second signals from the detector array to be provided to the readout circuit 700.

Figure 14:
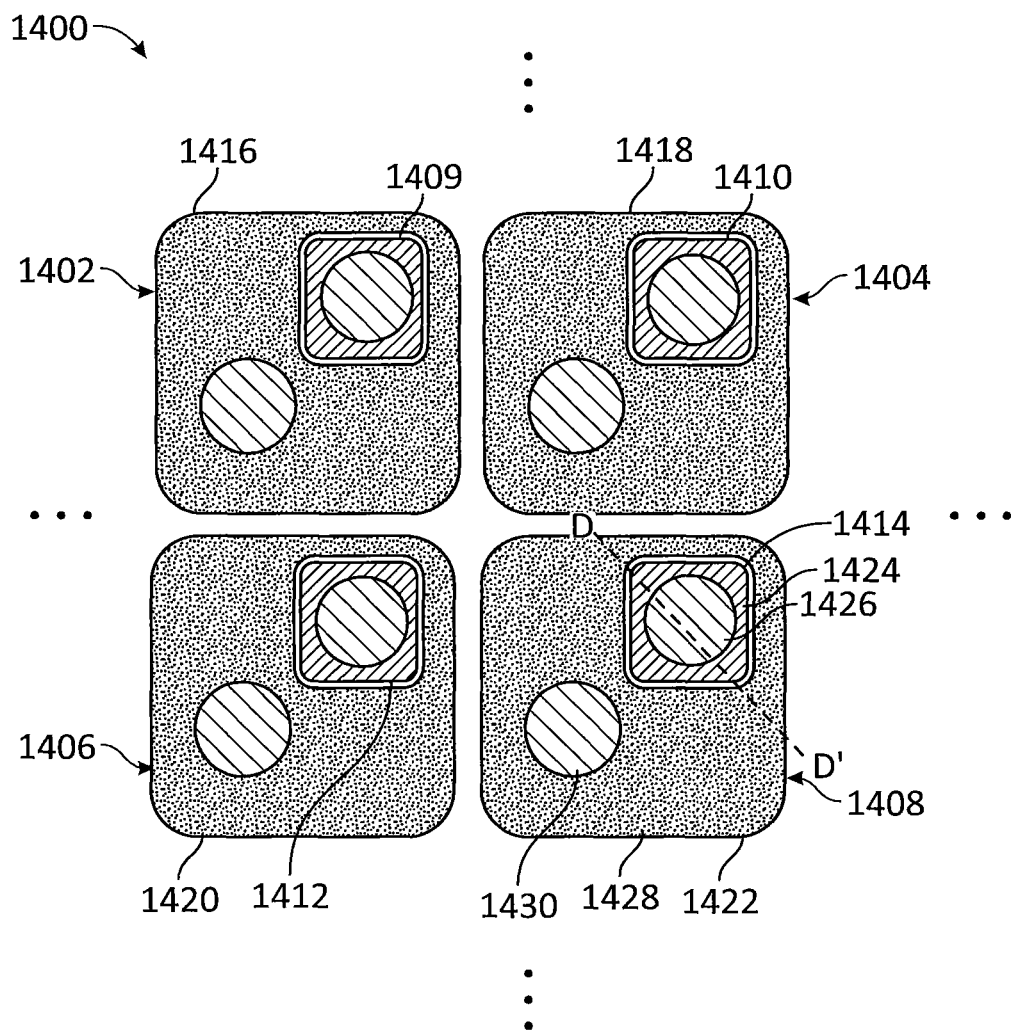
FIG. 14 illustrates a top-down view of an example array of macrocells in accordance with one or more embodiments of the present disclosure.
Figure 15:
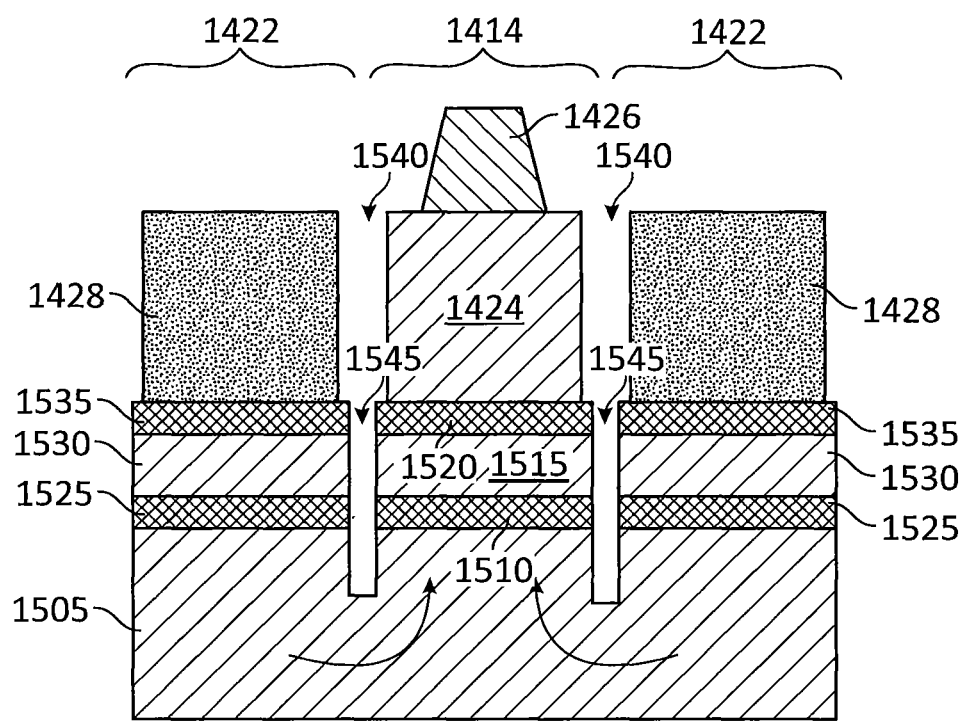
FIG. 15 illustrates a cross-sectional side view of an example macrocell taken along a plane formed by a line D-D' identified in FIG. 14 in accordance with one or more embodiments of the present disclosure.

Although the foregoing is with reference to the macrocell 400 of FIG. 4, other macrocells (or no macrocells) may be utilized. As another example of a macrocell, FIG. 14 illustrates a top-down view of an example array 1400 of macrocells in accordance with one or more embodiments of the present disclosure. FIG. 15 illustrates a cross-sectional side view of the macrocell taken along a plane formed by a line D-D' identified in FIG. 14 in accordance with one or more embodiments of the present disclosure.

The array 1400 of macrocells includes macrocells 1402, 1404, 1406, and 1408. The ellipses to the left, right, above, and below the array 1400 of macrocells indicate that one or more additional macrocells or no macrocells are provided to the left, right, above, or below, respectively, the array 1400 of macrocells. The macrocell 1402 includes a Band 1 pixel 1409 and a Band 2 pixel 1416. The macrocell 1404 includes a Band 1 pixel 1410 and a Band 2 pixel 1418. The macrocell 1406 includes a Band 1 pixel 1412 and a Band 2 pixel 1420. The macrocell 1408 includes a Band 1 pixel 1414 and a Band 2 pixel 1422. In FIG. 14, each of the Band 1 pixels 1409, 1410, 1412, and 1414 is surrounded by the Band 2 pixels 1416, 1418, 1420, and 1422, respectively. A ratio of a number of Band 2 pixels to a number of Band 1 pixels is 1:1. As an example, Band 1 may be a SWIR waveband and Band 2 may be a LWIR waveband. As another example, Band 1 may be a waveband in a portion of the visible-light spectrum and Band 2 may be a waveband in another portion of the visible-light spectrum and/or a portion of the IR spectrum.

As shown in FIGS. 14 and 15, the Band 1 pixel 1414 includes layers 1505 (e.g., a portion of the layer 1505) and 1424 having a first conductivity type, a layer 1515 having a second conductivity type, barrier layers 1510 and 1520, and a detector contact 1426. The Band 2 pixel 1422 includes the layer 1505 (e.g., a portion thereof), a layer 1428 having the first conductivity type, a layer 1530 having the second conductivity type, barrier layers 1525 and 1535, and a detector contact 1430. Gaps 1540 separate the layer 1424 of the Band 1 pixel 1414 from the layer 1428 of the Band 2 pixel 1422. Gaps 1545 separate the layers 1510, 1515, and 1520 of the Band 1 pixel 1414 from the layers 1525, 1530, and 1535 of the Band 2 pixel 1422. The gaps 1545 also partially separate the layer 1505. A bias circuit (e.g., the bias circuit 1020 of FIG. 10) may connect the detector contact 1426 of the Band 1 pixel 1414 with a first ground contact (e.g., the ground contact 642 of FIGS. 6A and 6B), and may connect the detector contact 1430 of the Band 2 pixel 1422 with a second ground contact (e.g., the ground contact 644 of FIGS. 6A and 6B). The foregoing description pertaining to forming an imaging device and operating an imaging device provided in FIGS. 11, 13, and other figures generally apply to FIGS. 14 and 15.

Figure 16:
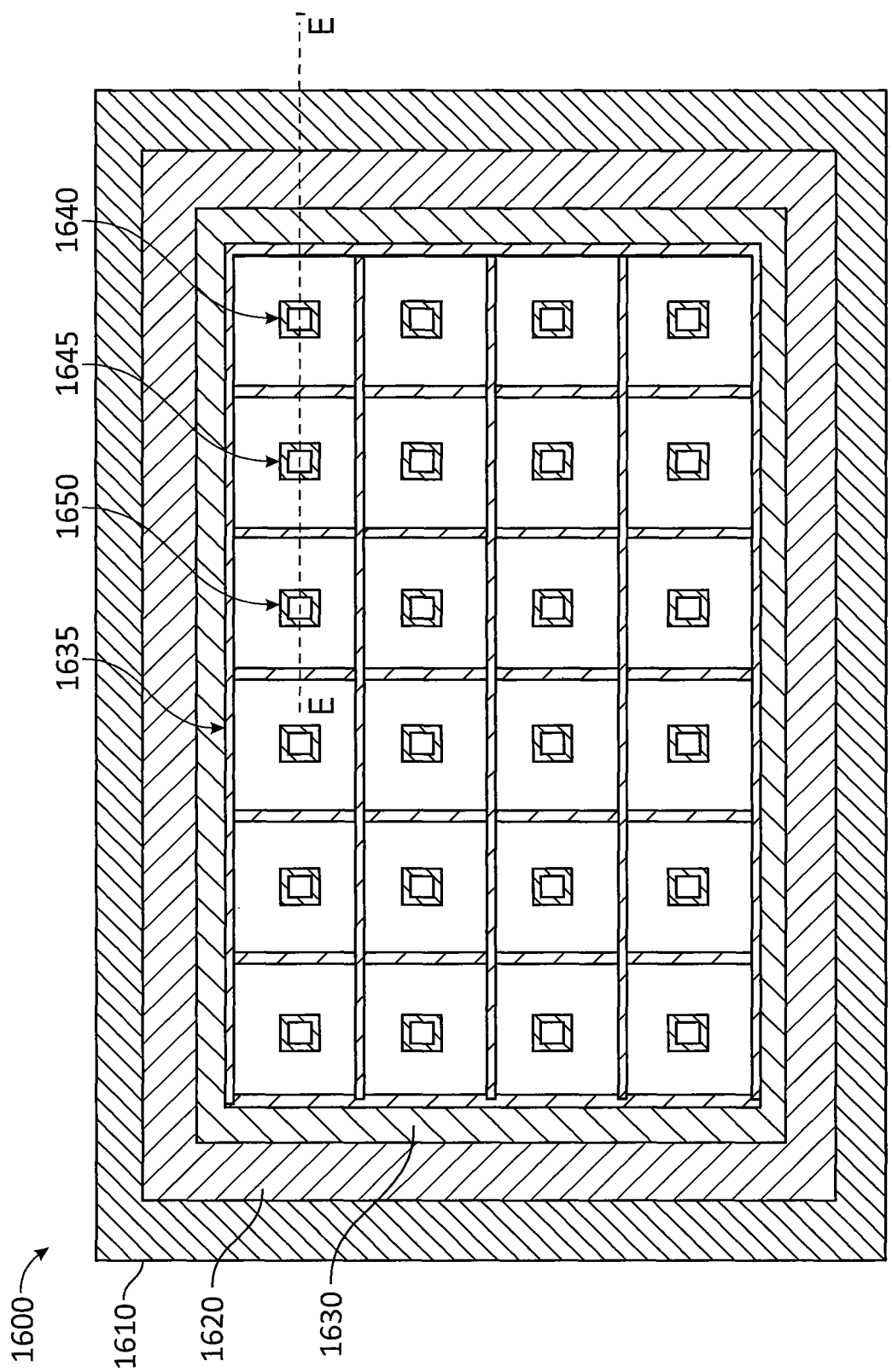
FIG. 16 illustrates a top-down view of a detector in accordance with one or more embodiments of the present disclosure.
Figure 17:
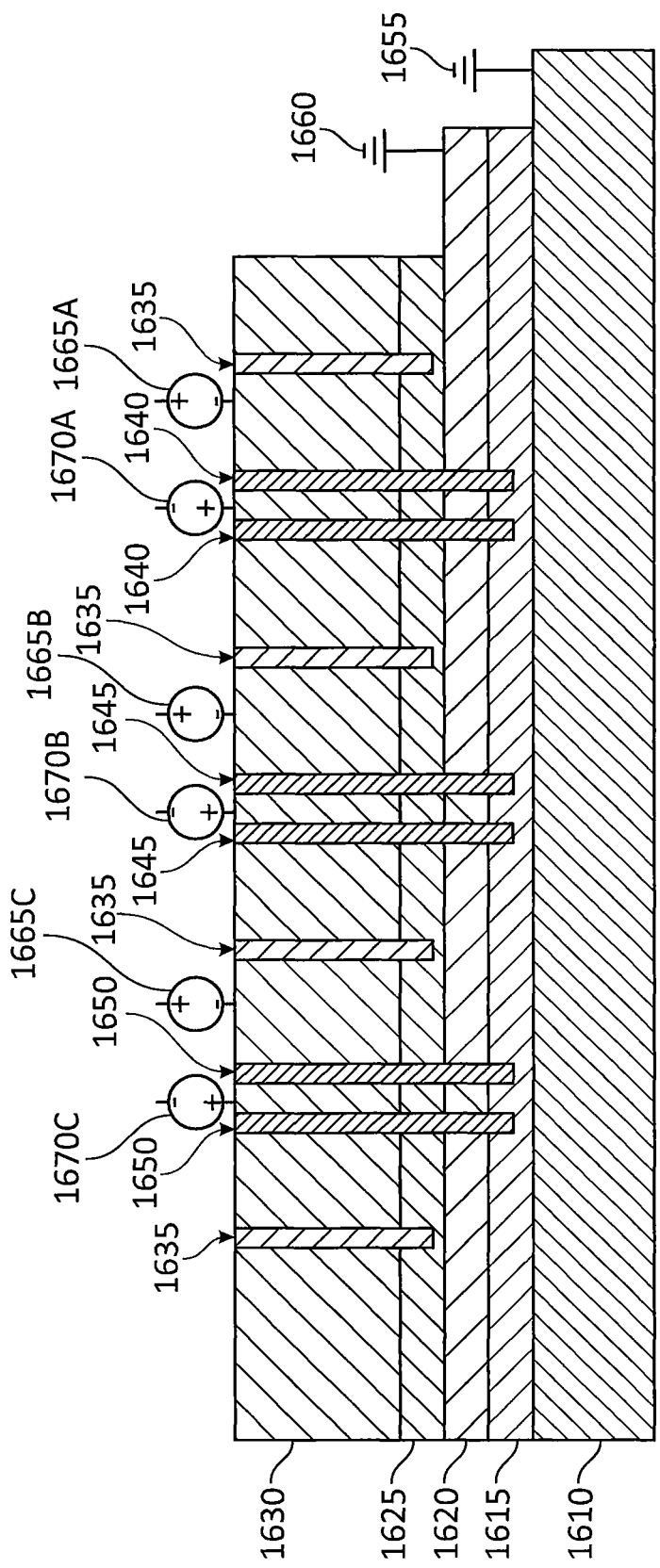
FIG. 17 illustrates a cross-sectional side view of a portion of the detector of FIG. 17 taken along a plane formed by a line E-E' identified in FIG. 16 in accordance with one or more embodiments of the present disclosure.

FIG. 16 illustrates a top-down view of a detector 1600 in accordance with one or more embodiments of the present disclosure. FIG. 17 illustrates a cross-sectional side view of a portion of the detector 1600 along a plane formed by a line E-E' identified in FIG. 16 in accordance with one or more embodiments of the present disclosure.

The detector 1600 includes a layer 1610 (e.g., an n-type absorber layer), a layer 1615 (e.g., a barrier layer) disposed on the layer 1610, a layer 1620 (e.g., a p-type layer) disposed on the layer 1615, a layer 1625 (e.g., a barrier layer) disposed on the layer 1620, and a layer 1630 (e.g., an n-type absorber layer) disposed on the layer 1625. A gap 1635 extends through the layer 1630 and partially extends through the layer 1625. Gaps 1640, 1645, and 1650 (and other similar gaps not explicitly labeled in FIG. 16) extend through the layers 1620, 1625, and 1630 and partially extend through the layer 1615. Each of the gaps 1640, 1645, 1650, etc. may be associated with defining of a respective Band 1 pixel. The gap 1635 forms individual gaps that each surround one of the gaps 1640, 1645, 1650, etc. Each of these individual gaps (formed by the gap 1635) may be associated with defining of a respective Band 2 pixel. In this regard, in an aspect, the detector 1600 provides a 4×6 array of Band 1 pixels and a 4×6 array of Band 2 pixels. In some aspects, each of the gaps 1635, 1640, 1645, 1650, etc. may optionally be filled with a passivation material. The gap 1635 has a different depth from the gaps 1640, 1645, 1650, etc.

In an embodiment, the layer 1610 provides a continuous layer to facilitate electrical continuity of the Band 1 pixels with the ground contact 1655. Such electrical continuity facilitates transport of photogenerated carriers from the layer 1610 to the detector contact. The layer 1610 provides a larger area that facilitates lateral collection of photogenerated carriers. The layer 1625 provides a continuous layer for the Band 2 pixels that facilitates electrical continuity of the Band 2 pixels with the ground contact 1660. Similarly, the layers 1615 and 1625 provide a continuous layer for the Band 2 pixels that facilitates electrical continuity of the Band 2 pixels with the ground contact 1660. The gaps 1640, 1645, 1650, etc. delineate/separate the Band 1 pixels from the Band 2 pixels as well as from other Band 1 pixels. The layer 1625 is a sheet of material with holes defined by the gaps 1635, 1640, 1645, 1650, etc. The layers 1620 and 1615 are sheets of material with holes defined by the gaps 1640, 1645, 1650, etc. In this regard, each of the layers 1630, 1625, 1620, 1615, and 1610 is a mostly intact sheet/film of material. In some cases, the Band 1 pixels and the Band 2 pixels may form a honeycomb structure. In one example, a fill factor associated with the Band 1 pixel may be near unity.

Each of the gaps 1640, 1645, 1650, etc. forms a mesa/pillar associated with a Band 1 pixel. Similarly, each of the individual gaps of the gap 1635 forms a mesa/pillar (with a recess defined by the mesa/pillar associated with a Band 1 pixel). Each of these mesas/pillars associated with the Band 1 pixels and Band 2 pixels may have a detector contact disposed thereon. The detector contact of each of the Band 1 pixels may be connected to a ground contact 1655 that is provided on the layer 1610. The detector contact of each of the Band 2 pixels may be connected to a ground contact 1660 that is provided on the layer 1620. In some cases, the mesas/pillars associated with the Band 1 pixels are formed such that they have a smaller area (e.g., as shown in the top-view of FIG. 16) compared to their respective surrounding mesa/pillar associated with the Band 2 pixels. The smaller area facilitates disposing of a detector contact on the mesa/pillar associated with the Band 2 pixels. A contact bump (e.g., indium bump contact) may be coupled to the detector contact (e.g., to couple the detector 1600 to a readout circuit). The mesas/pillars associated with the Band 1 pixels and the Band 2 pixels may be appropriately defined to accommodate desired contact bump patterns/densities. Although FIGS. 16 and 17 show the mesa/pillar of each Band 1 pixel-Band 2 pixel pair as being substantially concentric, in other cases, the centers of the mesas/pillars associated with the Band 1 pixels do not align with the centers of the mesas/pillars associated with the Band 2 pixels. It is noted that the mesas/pillars need not be square-shaped.

In some aspects, two etches may be utilized to remove conductive material to form the gaps 1640, 1645, 1650, etc. associated with the Band 1 pixels and the gap 1635 associated with the Band 2 pixels. A first etch extends to the layer 1625 (e.g., top barrier layer) to form the gap 1635. A second etch extends to the layer 1615 (e.g., bottom barrier layer) to form the gaps 1640, 1645, 1650, etc. The first etch may be performed before or after the second etch. Although the foregoing describes etches being performed, other material removal operations such as drilling operations may be performed to form the gaps 1635, 1640, 1645, 1650, etc. In some aspects, each of the gaps 1635, 1640, 1645, 1650, etc. may be optionally filled with a passivation material.

Biasing may be performed to apply a potential difference between the detector contacts of the Band 1 pixels and the ground contact 1655, and a potential difference between the detector contacts of the Band 2 pixels and the ground contact 1660. In an aspect, the ground contacts 1655 and 1660 are tied to different potentials. Each of power supplies 1665A-C may be utilized to bias a respective Band 1 pixel. Each of power supplies 1670A-C may be utilized to bias a respective Band 2 pixel. Although the power supplies 1665A-C are shown as separate power supplies, the power supplies 1665A-C may be implemented using a single common power supply (e.g., a common power rail) or other number of power supplies. Similarly, the power supplies 1670A-C may be implemented using a single common power supply (e.g., a common power rail) or other number of power supplies.

As an example, the layers 1610 and 1630 are n-type layers and the layer 1620 is a p-type layer to provide an npn structure having back-to-back np junctions. The layers 1630 and 1620 form np junctions, and the layers 1620 and 1610 form np junctions. As such, each of the Band 1 pixels and Band 2 pixels have an npn back-to-back diode stack structure. In this example, the ground contact 1655 may be referred to as an N ground or N contact, and the ground contact 1660 may be referred to as a P ground or P contact. In some aspects, to achieve simultaneity, each junction may be reverse biased continuously in time. It is noted that the bias scheme illustrated in FIG. 17 is provided by way of non-limiting example and may represent any bias or polarity based on application, as would be understood by one skilled in the art.

Dual color detectors provided according to various embodiments may allow increased dynamic range of the readout circuit. In some aspects, in a multi-barrier detector, by using two grounds that can support an electrostatic potential across them, a full ROIC voltage range on both color bands may be integrated.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked to and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. An imaging device comprising:
   a first pixel configured to detect first image data associated with a first waveband of electromagnetic radiation;
   a second pixel configured to detect second image data associated with a second waveband of the electromagnetic radiation, wherein at least a portion of the second waveband does not overlap the first waveband, wherein the second pixel comprises a first portion of a first layer, a second layer disposed on the first portion, and a third layer disposed on the second layer, wherein the first and third layers have a first conductivity type, and wherein the second layer has a second conductivity type different from the first conductivity type; and a bias circuit configured to:
  apply a first voltage between the first pixel and a first ground contact disposed on and in contact with the first layer; and
  apply a second voltage between the second pixel and a second ground contact disposed on and in contact with the second layer, wherein the first voltage is different from the second voltage.

2. The imaging device of claim 1, further comprising a readout circuit configured to obtain, as part of a single frame, a first signal indicative of the first image data from the first pixel and a second signal indicative of the second image data from the second pixel.

3. The imaging device of claim 1, wherein the bias circuit is configured to:
  apply the first voltage such that a first detector contact of the first pixel is at a lower potential than the first ground contact; and
  apply the second voltage such that a second detector contact of the second pixel is at a higher potential than the second ground contact.

4. The imaging device of claim 3, further comprising:
  a third pixel configured to detect third image data associated the first waveband; and
  a fourth pixel configured to detect fourth image data associated with the second waveband,
  wherein the bias circuit is further configured to:
    apply a third voltage between the third pixel and the first ground contact such that a third detector contact of the third pixel is at a lower potential than the first ground contact; and
    apply a fourth voltage between the fourth pixel and the second ground contact such that a fourth detector contact of the fourth pixel is at a higher potential than the second ground contact.

5. The imaging device of claim 3, wherein the first pixel and the second pixel are part of a focal plane array (FPA), and wherein the first ground contact and the second ground contact are along a periphery of the FPA.

6. The imaging device of claim 1, wherein the first pixel comprises a first back-to-back diode, wherein the second pixel comprises a second back-to-back diode, and wherein the second back-to-back diode comprises the first portion of the first layer, the second layer, and the third layer.

7. The imaging device of claim 6, wherein:
  the first back-to-back diode comprises:
    a second portion of the first layer;
    a fourth layer disposed on the second portion of the first layer, wherein the fourth layer has the second conductivity type; and
    a fifth layer disposed on the fourth layer, wherein the fifth layer has the first conductivity type.

8. The imaging device of claim 7, wherein the second layer and the fourth layer are portions of a first continuous layer having the second conductivity type, or wherein the third layer and the fifth layer are disjoint.

9. The imaging device of claim 7, wherein:
  one or more of the first layer, the second layer, the third layer, the fourth layer, or the fifth layer comprises a bulk material structure, a superlattice structure, a quantum well infrared photodetector structure, or a mercury cadmium telluride structure;
  the first conductivity type is an n-type conductivity; and
  the second conductivity type is a p-type conductivity.

10. The imaging device of claim 7, wherein:
  the first pixel further comprises:
    a first barrier layer disposed between and in contact with the second portion and the fourth layer; and/or
    a second barrier layer disposed between and in contact with the fourth layer and the fifth layer; and
  the second pixel further comprises:
    a third barrier layer disposed between and in contact with the first portion and the second layer; and/or
    a fourth barrier layer disposed between and in contact with the second layer and the third layer.

11. The imaging device of claim 10, wherein the first pixel comprises the second barrier layer, wherein the imaging device further comprises a third pixel configured to detect third image data associated with the first waveband of electromagnetic radiation, wherein the third pixel comprises:
  a third portion of the first layer;
  a fifth barrier layer disposed on the third portion of the first layer;
  a sixth layer disposed on the fifth barrier layer;
  a sixth barrier layer disposed on the sixth layer; and
  a seventh layer disposed on the sixth barrier layer, wherein:
    the second layer, the fourth layer, and the sixth layer are portions of a first continuous layer, and
    the second barrier layer and the sixth barrier layer are portions of a second continuous layer.

12. A method for fabricating an imaging device, the method comprising:
  forming a first layer having a first conductivity type;
  forming a second layer on the first layer, wherein the second layer has a second conductivity type different from the first conductivity type;
  forming a third layer on the second layer, wherein the third layer has the first conductivity type;
  forming a first set of pixels of the imaging device, wherein each pixel of the first set of pixels is formed by removing a respective portion of each of the first layer, the second layer, and the third layer, wherein the first set of pixels is associated with detection of a first waveband of electromagnetic radiation;
  forming a second set of pixels of the imaging device, wherein each pixel of the second set of pixels is formed by removing a respective portion of the first layer, wherein the second set of pixels is associated with detection of a second waveband of the electromagnetic radiation, and wherein at least a portion of the second waveband does not overlap the first waveband;
  forming a first ground contact on the first layer; and
  forming a second ground contact on the second layer.

13. The method of claim 12, further comprising coupling the first set of pixels and the second set of pixels to a readout circuit, and wherein
  the forming the first set of pixels comprises etching the first layer, the second layer, and third layer to remove the respective portion of each of the first layer, the second layer, and the third layer; and
  each pixel of the second set of pixels is formed by removing the respective portion of the first layer and a respective portion of the second layer.

14. The method of claim 12, further comprising:
  forming a first barrier layer on the first layer, wherein the first barrier layer is between and in contact with the first layer and the second layer; and
  forming a second barrier layer on the second layer, wherein the second barrier layer is between and in contact with the second layer and the third layer, wherein each pixel of the first set of pixels is formed by removing a respective portion of each of the first layer, the second layer, the third layer, the first barrier layer, and the second barrier layer.

15. The method of claim 12, wherein the first set of pixels and the second set of pixels form a focal plane array (FPA), wherein the method further comprises:
   forming a detector contact for each pixel of the first set of pixels and each pixel of the second set of pixels,
   wherein the first ground contact and the second ground contact are formed along a periphery of the FPA.

16. A method for operating an imaging device, the method comprising:
   applying, by a bias circuit of the imaging device, a first voltage between a first pixel of the imaging device and a first ground contact;
   applying, by the bias circuit, a second voltage between a second pixel of the imaging device and a second ground contact, wherein the second pixel comprises a first portion of a first layer, a second layer disposed on the first portion, and a third layer disposed on the second layer, wherein the first and third layers have a first conductivity type, wherein the second layer has a second conductivity type different from the first conductivity type, wherein the first ground contact is disposed on and in contact with the first layer, and wherein the second ground contact is disposed on and in contact with the second layer;
   detecting, by the first pixel, first image data associated with a first waveband of electromagnetic radiation; and
   detecting, by the second pixel, second image data associated with a second waveband of the electromagnetic radiation, wherein at least a portion of the second waveband does not overlap the first waveband.

17. The method of claim 16, further comprising:
   generating, by the first pixel, a first signal indicative of the first image data;
   generating, by the second pixel, a second signal indicative of the second image data; and
   receiving, by a readout circuit of the imaging device, the first signal and the second signal as part of a single frame.

18. The method of claim 16, wherein:
   the applying the first voltage comprises applying the first voltage such that a first detector contact of the first pixel is at a lower potential than the first ground contact; and
   the applying the second voltage comprises applying the second voltage such that a second detector contact of the second pixel is at higher potential than the second ground contact; and
   the method further comprises:
      applying, by the bias circuit, a third voltage between a third pixel of the imaging device and the first ground contact such that the third pixel is at a lower potential than the first ground contact;
      applying, by the bias circuit, a fourth voltage between a fourth pixel of the imaging device and the second ground contact such that the fourth pixel is at a higher potential than the second ground contact;
      detecting, by the third pixel, third image data associated with the first waveband; and
      detecting, by the fourth pixel, fourth image data associated with the second waveband.

19. The method of claim 16, wherein:
   the first pixel comprises:
      a second portion of the first layer;
      a fourth layer disposed on the second portion of the first layer, wherein the fourth layer has the second conductivity type; and
      a fifth layer disposed on the fourth layer, wherein the fifth layer has the first conductivity type; and
   the third layer and the fifth layer are disjoint.

20. The method of claim 19, wherein:
   the first pixel further comprises:
      a first barrier layer disposed between and in contact with the second portion and the fourth layer; and/or
      a second barrier layer disposed between and in contact with the fourth layer and the fifth layer; and
   the second pixel further comprises:
      a third barrier layer disposed between and in contact with the first portion and the second layer; and
      a fourth barrier layer disposed between and in contact with the second layer and the third layer; and/or
   the second layer and the fourth layer are portions of a continuous layer having the second conductivity type.

* * * * *